US010347831B2

(12) United States Patent
Gealy et al.

(10) Patent No.: US 10,347,831 B2
(45) Date of Patent: *Jul. 9, 2019

(54) DOPING OF SELECTOR AND STORAGE MATERIALS OF A MEMORY CELL

(71) Applicant: Intel Corporation, Santa Clara, CA (US)

(72) Inventors: Daniel Gealy, Kuna, ID (US); Andrea Gotti, Vaprio d'Adda (IT); Dale W. Collins, Boise, ID (US); Swapnil A. Lengade, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/007,563

(22) Filed: Jun. 13, 2018

(65) Prior Publication Data

US 2018/0337329 A1 Nov. 22, 2018

Related U.S. Application Data

(63) Continuation of application No. 15/391,757, filed on Dec. 27, 2016, now Pat. No. 10,008,665.

(51) Int. Cl.
*H01L 45/00* (2006.01)
*H01L 27/24* (2006.01)
*G11C 13/00* (2006.01)

(52) U.S. Cl.
CPC .......... *H01L 45/06* (2013.01); *G11C 13/0004* (2013.01); *H01L 27/2481* (2013.01);
(Continued)

(58) Field of Classification Search
CPC ... H01L 45/06; H01L 45/141; H01L 27/2481; G11C 13/0004
See application file for complete search history.

(56) References Cited

U.S. PATENT DOCUMENTS 6,800,504 B2   10/2004   Li et al.
9,305,976 B2    4/2016   Cho
(Continued)

OTHER PUBLICATIONS

International Search Report and Written Opinion for PCT Patent Application No. PCT/US2017/060450, dated Feb. 13, 2018, 14 pages.

(Continued)

*Primary Examiner* — Allison Bernstein
(74) *Attorney, Agent, or Firm* — Compass IP Law, PC

(57) ABSTRACT

Doping a storage element, a selector element, or both, of a memory cell with a dopant including one or more of aluminum (Al), zirconium (Zr), hafnium (Hf), and silicon (Si), can minimize volume or density changes in a phase change memory as well as minimize electromigration, in accordance with embodiments. In one embodiment, a memory cell includes a first electrode and a second electrode, and a storage element comprising a layer of doped phase change material between the first and second electrodes, wherein the doped phase change material includes one or more of aluminum, zirconium, hafnium, and silicon. The storage element, a selector element, or both can be doped using techniques such as cosputtering or deposition of alternating layers of a dopant layer and a storage (or selector) material.

16 Claims, 15 Drawing Sheets

(52) U.S. Cl.
CPC ...... *H01L 45/1233* (2013.01); *H01L 45/1253* (2013.01); *H01L 45/141* (2013.01); *H01L 45/145* (2013.01); *G11C 2213/52* (2013.01); *G11C 2213/71* (2013.01); *G11C 2213/76* (2013.01)

(56) References Cited

U.S. PATENT DOCUMENTS

| | | |
|---|---|---|
| 9,559,146 B2 | 1/2017 | Liu et al. |
| 2008/0042167 A1 | 2/2008 | Chen et al. |
| 2009/0072215 A1 | 3/2009 | Lung et al. |
| 2009/0140233 A1 | 6/2009 | Kinoshita et al. |
| 2011/0049456 A1 | 3/2011 | Lung et al. |
| 2014/0268991 A1 | 9/2014 | Hu et al. |
| 2014/0353568 A1 | 12/2014 | Boniardi et al. |
| 2016/0149127 A1 | 5/2016 | Kau |
| 2017/0117328 A1* | 4/2017 | Terai .................. H01L 27/2481 |

OTHER PUBLICATIONS

Office Action for U.S. Appl. No. 15/391,757, dated Aug. 29, 2017, 11 pages.

* cited by examiner

US 10,347,831 B2

DOPING OF SELECTOR AND STORAGE MATERIALS OF A MEMORY CELL

RELATED APPLICATIONS

This application is a continuation of and claims the benefit of priority of U.S. patent application Ser. No. 15/391,757, titled "DOPING OF SELECTOR AND STORAGE MATERIALS OF A MEMORY CELL," filed Dec. 27, 2016, which is hereby incorporated by reference in its entirety.

FIELD

The descriptions are generally related to memory, and more particularly, to a doping of a selector or storage material of a memory cell to minimize volume changes and electromigration within the memory cell.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2016, Intel Corporation, All Rights Reserved.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

Doping the selector material, storage material, or both, of a memory including chalcogenide materials can minimize or eliminate volume changes for phase change materials and electromigration in the memory cells. Decreasing electromigration and volume changes in memory cells can enable increased longevity of the memory device. One memory technology that can be implemented using chalcogenide materials is three-dimensional (3D) cross-point memory.

Some 3D cross-point devices include a stack of materials including a selector material, a storage material, and conductive layers, which are patterned to form an array of memory cells with conductive wordlines and bitlines. Patterning the stack results in "cross-points." A cross-point is an intersection between a bitline, a wordline, and active material(s) (e.g., the selector and/or storage material). The storage material (or memory material) is capable of storing data. The selector material enables accessing a single bit in the array.

Typically, 3D cross-point devices can experience undesirable effects with use over time. For example, 3D cross-point devices can experience electromigration of elements that can result in memory cell failure, or density or volume changes that cause mechanical strain on the device and eventually lead to memory cell failure.

In contrast to existing memory technologies that experience detrimental volume changes and electromigration, embodiments include memory devices in which the storage material, selector material, or both are doped with elements to reduce or eliminate volume changes and minimize electromigration. In accordance with embodiments, the storage elements of the memory devices include a doped phase change material that includes aluminum, zirconium, hafnium, or silicon. In one embodiment, unexpectedly, a memory device with an aluminum-doped phase change material experiences minimal or no volume change when in an amorphous or crystalline state. Also unexpectedly, a memory device with an aluminum-doped selector material experiences minimal electromigration, in accordance with embodiments.

Figure 1:
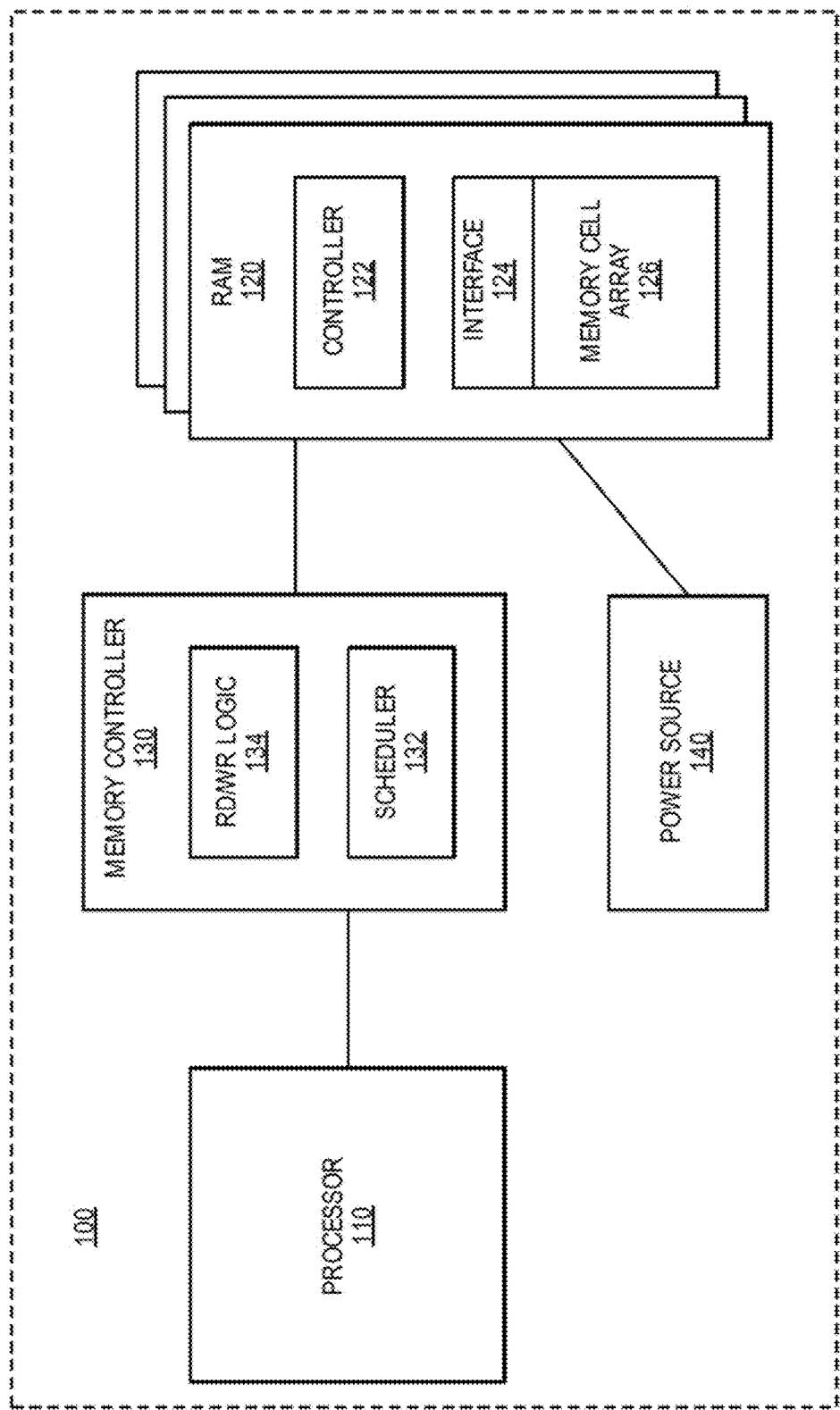
FIG. 1 is a block diagram of a system that includes a memory cell array, in accordance with an embodiment.

FIG. 1 is a block diagram of a system that includes a memory cell array, in accordance with an embodiment.

System 100 includes components of a memory subsystem having random access memory (RAM) 120 to store and provide data in response to operations of processor 110. System 100 receives memory access requests from a host or a processor 110, which is processing logic that executes operations based on data stored in RAM 120 or generates data to store in RAM 120. Processor 110 can be or include a host processor, central processing unit (CPU), microcontroller or microprocessor, graphics processor, peripheral processor, application specific processor, or other processor, and can be single core or multicore.

System 100 includes memory controller 130, which represents logic to interface with RAM 120 and manage access to data stored in the memory. In one embodiment, memory controller 130 is integrated into the hardware of processor 110. In one embodiment, memory controller 130 is stand-alone hardware, separate from processor 110. Memory controller 130 can be a separate circuit on a substrate that includes the processor. Memory controller 130 can be a separate die or chip integrated on a common substrate with a processor die (e.g., as a system on a chip (SoC)). In one embodiment, memory controller 130 is an integrated memory controller (iMC) integrated as a circuit on the processor die. In one embodiment, at least some of RAM 120 can be included on an SoC with memory controller 130 and/or processor 110.

In one embodiment, memory controller 130 includes read/write logic 134, which includes hardware to interface with RAM 120. Logic 134 enables memory controller 130 to generate read and write commands to service requests for data access generated by the execution of instructions by processor 110. In one embodiment, memory controller 130 includes scheduler 132 to schedule the sending of access commands to RAM 120 based on known timing parameters for read and write access for RAM 120. Known timing parameters can be those that are preprogrammed or otherwise preconfigured into system 100. Such parameters can be stored in RAM 120 and accessed by memory controller 130. In one embodiment, at least some parameters are determined by synchronization procedures. The timing parameters can include the timing associated with write latency for RAM 120. The write latency for RAM 120 can depend on the type of memory technology. RAM 120 can be a memory with a doped storage and/or selector material, as is described in further detail below. In one such embodiment, the phase change memory includes a phase change region made of a phase change material. A phase change material can be electrically switched between a generally amorphous and a generally crystalline state across the entire spectrum between completely amorphous and completely crystalline states.

The memory resources or cachelines in RAM 120 are represented by memory device array 126, which can include a doped storage material and/or doped selector material in accordance with embodiments described herein. RAM 120 includes interface 124 (e.g., interface logic) to control the access to memory device array 126. Interface 124 can include decode logic, including logic to address specific rows or columns or bits of data. In one embodiment, interface 124 includes logic to control the amount of current provided to specific memory cells of memory device array 126. Thus, control over writing to memory device array 126 can occur through driver and/or other access logic of interface 124. Controller 122 represents an on-die controller on RAM 120 to control its internal operations to execute commands received from memory controller 130. For example, controller 122 can control any of timing, addressing, I/O (input/output) margining, scheduling, and error correction for RAM 120.

In one embodiment, controller 122 is configured to read and write memory device array 126 in accordance with any embodiment described herein. In one embodiment, controller 122 can differentiate between different logic-states as a consequence of the programming polarity of a memory cell. For example, in one embodiment, controller 122 can read a memory cell by applying a voltage drop via interface 124 to the memory cell to determine the state (e.g., a higher stable state or lower stable state) of the memory cell.

In one embodiment, when controller 122 is to write to a memory cell, controller 122 applies a quick pulse to the memory cell to program the polarity of the memory cell. In one such embodiment, programming in forward polarity will put the cell in one state (e.g., a lower threshold state) and programming in reverse polarity will put the cell in the other state (e.g., a higher threshold state). For example, in one embodiment, controller 122 applies a pulse in one polarity (e.g., bitline positive and wordline negative) to write a value (e.g., a '1') or in the other polarity (e.g., bitline negative and wordline positive) to write another value (e.g., a '0'). In one such embodiment, controller 122 applies a pulse that is sufficient to trigger the storage material in its higher or lower stable state. System 100 includes power source 140, which can be a voltage source or regulator that provides power to RAM 120. Controller 122 and interface 124 can use the power available from power source 140 to apply a voltage drop to access a memory cell of array 126.

Figure 2:
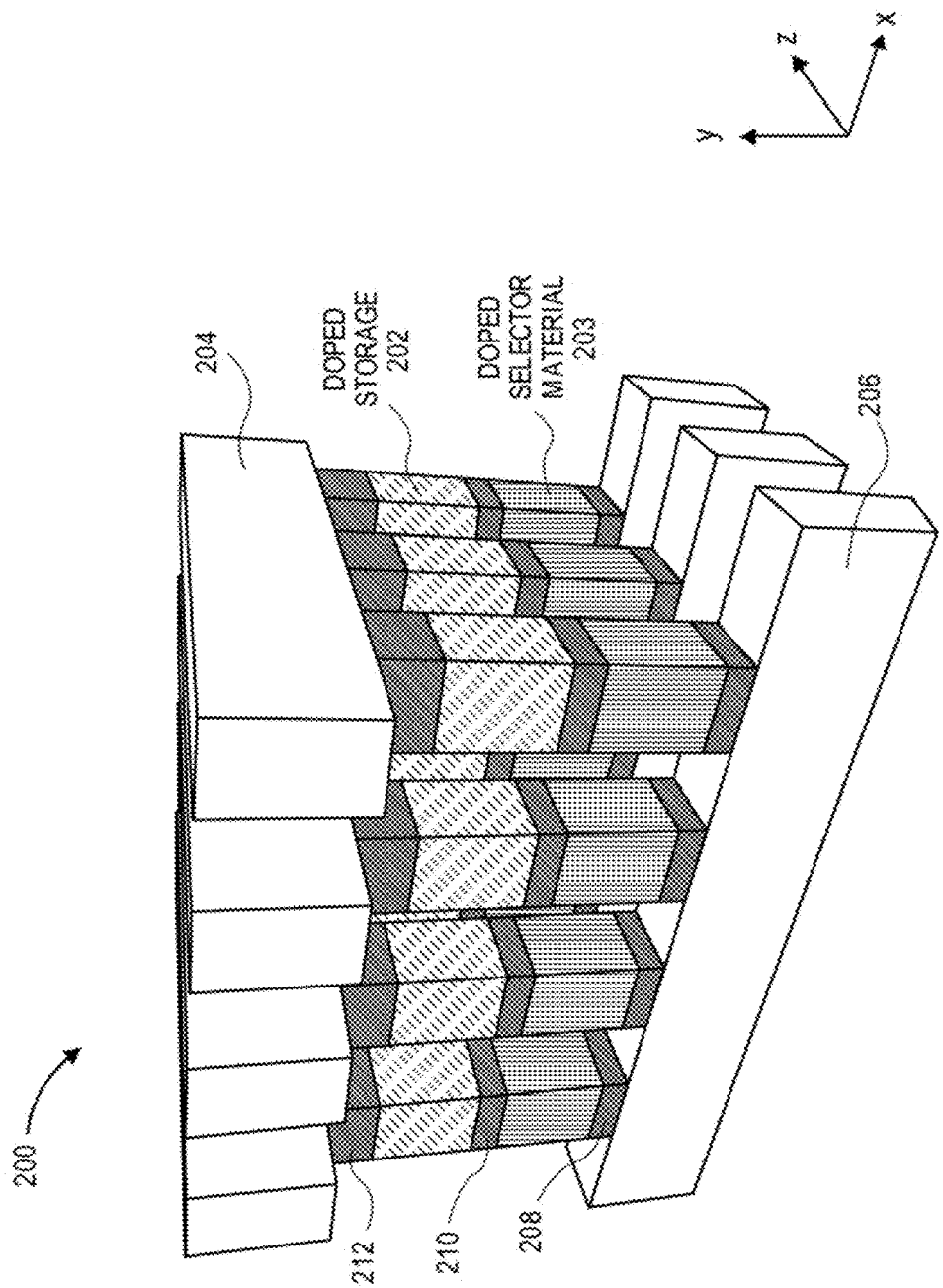
FIG. 2 illustrates a portion of a memory cell array, in accordance with an embodiment.

FIG. 2 illustrates a portion of a memory cell array 200, such as the memory cell array 126 of FIG. 1, in accordance with an embodiment. Memory cell array 200 is an example of a three dimensional (3D) cross-point memory structure. The memory cell array 200 includes a plurality of access lines 204, 206 to couple the memory cells with access circuitry. Access lines 204, 206 can be referred to as bitlines and wordlines. In the embodiment illustrated in FIG. 2, the bitlines (e.g., access lines 204) are orthogonal to the wordlines (e.g., access lines 206). In the embodiment illustrated in FIG. 2, a storage material 202 and selector material 203 are disposed between the access lines 204, 206. In one embodiment, a "cross-point" is formed at an intersection between a bitline and a wordline. A memory cell is created from the storage material 202 between the bitline and wordline where the bitline and wordline intersect. The storage material 202 can be a phase change material, as mentioned above with respect to FIG. 1. In one embodiment, the storage material 202 includes a chalcogenide material. In accordance with one embodiment, the selector material 203 comprises a chalcogenide glass.

Referring again to the access lines 204, 206, the wordline is for accessing a particular word in a memory array and the bitline is for accessing a particular bit in the word. The access lines 204, 206 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In the embodiment illustrated in FIG. 2, the memory array 200 includes conductive electrodes 208, 210 and 212. The conductive electrodes 212 are between the access line 204 and the storage material 202, and can be referred to herein as "top electrodes." The conductive electrodes 210 are between the storage material 202 and the selector material 203, and can be referred to as "middle electrodes." The electrodes 208 are between the selector material 203 and the access line 206, and can be referred to as "bottom electrodes." The terms "top," "middle," or "bottom" are used for ease of reference; different labels could be used (e.g., the electrodes 208 could be referred to as "top" electrodes, and the electrodes 212 could be referred to as "bottom" electrodes). Electrodes 208, 210, and 212 electrically couple the layers that are on either side of a given electrode. Electrodes 208, 210, and 212 can be composed of one or more conductive and/or semiconductive materials such as, for example: carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

As mentioned briefly above, memory cells of the array 200 can be programmed by applying voltage pulses to the cells. In one embodiment, writing information to memory cells involves applying voltage pulses with particular polarities to the memory cells. For example, programming a memory cell with a voltage pulse with one polarity results in the memory cell being in one logic state (e.g., a "logic 0"), and programming the memory cell with a voltage pulse with a different polarity results in the memory cell being in a different logic state (e.g., "logic 1"). Similarly, reading such memory cells can involve applying voltage pulses to the memory cells and detecting electrical responses from the memory cells.

In the illustrated embodiment, the storage material 202 is a phase change material. Therefore, programming a memory cell involves sending current through the cell, which creates heat to cause the memory cell to transition from a crystalline to amorphous state, or from an amorphous to crystalline state. The logic states of the memory (e.g., a logic '1' or '0', or a 'set' and 'reset' state) can be defined by the physical state of the phase change material. For example, in one embodiment, amorphous material has high resistivity (e.g., a reset state) and the crystalline material has low resistivity (e.g., a set state). Typically, phase change materials undergo a density or volume change when transitioning to or from a crystalline or amorphous state. For example, a typical phase change material gets larger when it transitions from a crystalline state to an amorphous state, and shrinks when it transitions from an amorphous state to a crystalline state. In one embodiment, the density differences between the amorphous and crystalline phase can be around 6%. In accordance with embodiments, the memory cell is laterally confined in all directions. Thus, the volume change associated with switching between crystalline and amorphous states with different densities causes mechanical stress of the surrounding structures (e.g., array liners, fills, and other structures) and can lead to failure during the cell cycling.

Additionally, programming a memory cell can result in electromigration of the different materials in the storage material 202. For example, in a phase change material that includes tellurium and antimuonium (such as GST), the tellurium tends to move towards one end of the memory cell (e.g., in the direction of the current), and the antimuonium tends to move towards the opposite end of the memory cell (e.g., in the opposite direction of the current). The selector material 203 of a memory cell can also experience electromigration. Electromigration can inhibit the speed of the memory device, and eventually lead to failure of the device.

In contrast to existing phase change memories, the storage material can include a phase change material that is doped with dopants that reduce the volume change of the phase change material between the amorphous and crystalline state, and can also minimize electromigration within the cell. For example, the phase change material can include $Ge_xSb_yTe_z$ (referred to as germanium-antimony-tellurium or GST), or another suitable phase change material. The phase change material is doped with dopants that include one or more of: aluminum (Al), zirconium (Zr), hafnium (Hf), and silicon (Si). In one such embodiment, the dopant can include an oxide or nitride, such as aluminum oxide (e.g., $Al_2O_3$), aluminum nitride (AlN), zirconium oxide (e.g., $ZrO_2$), zirconium nitride (e.g., ZrN), hafnium oxide (e.g., $HfO_2$), hafnium nitride (e.g., HfN), silicon oxide (e.g., $SiO_2$), or silicon nitride (e.g., $Si_3N_4$). The doped storage material can be formed in a variety of ways, such as via cosputtering or via formation of alternating layers of storage material and dopant, as described in more detail below. According to embodiments, the doped storage material is a solid solution of a storage material (e.g., chalcogenide material) and a dopant.

In accordance with embodiments, the phase change material doped with such dopants unexpectedly results in a phase change material that experiences no volume change between the amorphous and crystalline state, while maintaining its other characteristics (e.g., electrical and properties). Typically, doping a phase change material results in significant changes to crystallization or electrical properties of the phase change material that can render the phase change material unsuitable for high speed memory applications. For example, doping a phase change material can result in a significantly higher crystallization temperature, which results in slower access time due to the increased time required to reach the higher crystallization temperature. In contrast, a phase change material doped with dopants that include one or more of aluminum (Al), zirconium (Zr), hafnium (Hf), and silicon (Si) experience little to no volume change, but do not experience changes to electrical or crystallization properties that affect its effectiveness for use in high speed applications.

For example, consider a chalcogenide material doped with an aluminum-containing dopant. Aluminum, when used as a dopant in materials other than phase change materials, is not known to eliminate the volume changes in other materials. Additionally, doping other materials (materials other than phase change materials) with aluminum can have significant effects on the doped material's electrical properties. Accordingly, it was also not expected that an aluminum-containing dopant would eliminate the volume change in phase change materials without significantly altering other properties such as crystallization temperature. However, a phase change material doped with aluminum unexpectedly experienced no volume changes when transitioning between amorphous and crystalline states, in accordance with an embodiment. The dopants described herein are thought to generate a stable or rigid framework within the phase change material that does not affect the phase change properties of the material, but stabilizes the volume and overall density to minimize the differences between the crystalline and amorphous states. Thus, a phase change material doped in accordance with embodiments herein can minimize or eliminate volume changes when undergoing phase changes. Doping a phase change material in accordance with embodiments herein can also significantly reduce or eliminate electromigration within a memory cell.

Referring again to the selector material 203, the selector material can include a chalcogenide material, such as a chalcogenide glass. In one such embodiment, the chalcogenide glass does not transition between amorphous and crystalline states, and therefore typically does not experience the volume change problems that typical phase change materials experience. However, the selector material 203 can experience electromigration. Doping the selector material with dopants containing one or more of aluminum (Al), zirconium (Zr), hafnium (Hf), and silicon (Si) can also minimize or eliminate electromigration within the selector element. The selector material can be doped with an oxide or nitride, such as aluminum oxide (e.g., $Al_2O_3$), aluminum nitride (AlN), zirconium oxide (e.g., $ZrO_2$), zirconium nitride (e.g., ZrN), hafnium oxide (e.g., $HfO_2$), hafnium nitride (e.g., HfN), silicon oxide (e.g., $SiO_2$), or silicon nitride (e.g., $Si_3N_4$). The doped selector material can be formed in a variety of ways, such as via cosputtering or via formation of alternating layers of selector material and dopant, as described in more detail below. According to embodiments, the doped selector material is a solid solution of a selector material (e.g., chalcogenide glass) and a dopant.

Thus, embodiments involve doping the storage material, selector material, or both, with a dopant to minimize volume changes and electromigration.

Although FIG. 2 illustrates an embodiment with a separate storage and selector layer, in other embodiments, a single material that has both memory and selection properties (a "self-selecting" material) can be used instead. For example, in one embodiment, a chalcogenide material can act as both a selector and a storage element without requiring separate layers. In one such embodiment, doping a self-selecting chalcogenide material can have similar or the same effects described herein with respect to a memory cell with separate storage and selector elements. For example, doping a memory cell that includes a self-selecting material in accordance with embodiments described herein can minimize electromigration within the memory cell.

Although a single level or layer of memory cells is shown in FIG. 2, memory cell array 200 can include multiple levels or layers of memory cells (e.g., in the y-direction). FIG. 2 illustrates one example of a memory cell array that can include a doped storage and/or selector material as described herein. However, other memory cell structures and arrays can include the doped storage and/or selector materials described herein.

Figure 3:
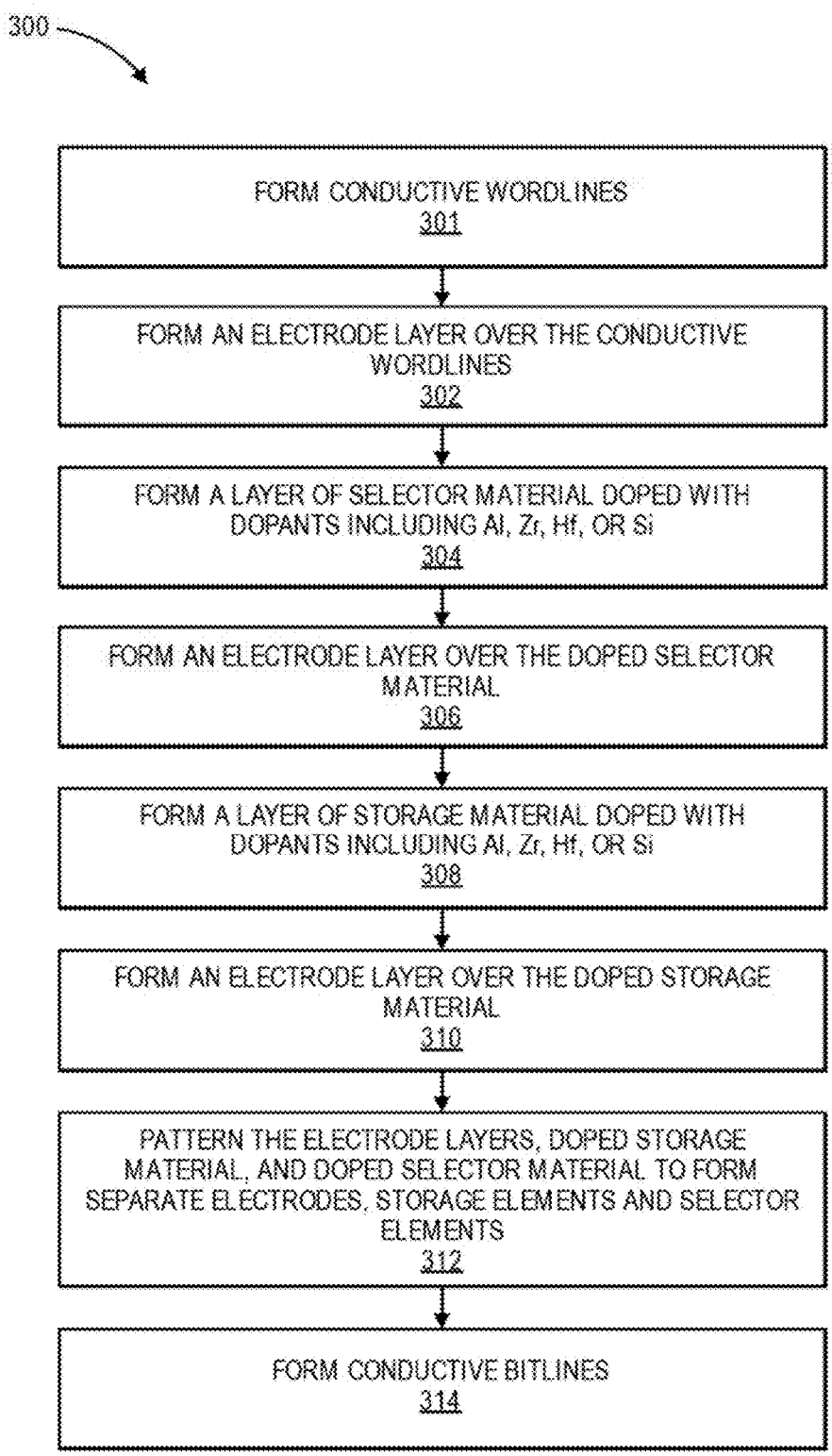
FIG. 3 is a flow diagram of a method of forming a memory cell array with doped layers of selector and storage material, in accordance with an embodiment.
Figure 10:
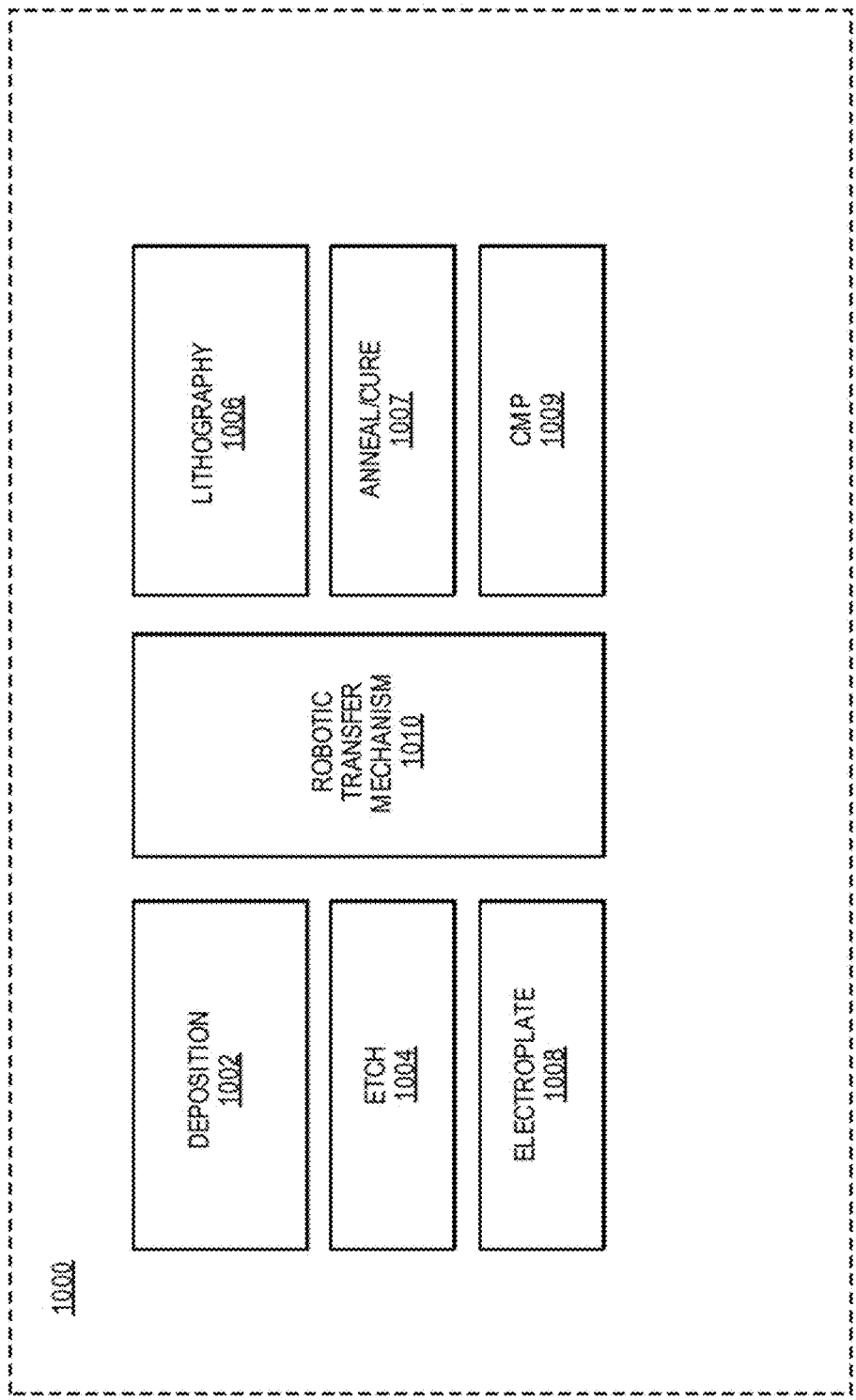
FIG. 10 is a block diagram of exemplary processing equipment for fabricating a memory cell array in accordance with embodiments described herein.

FIG. 3 is a flow diagram of a method of forming a memory cell array, in accordance with an embodiment. The process of FIG. 3 can be used to form an array of memory cells, such as the array 200 of FIG. 2. The operations of the processes can be performed by processing equipment capable of performing techniques such as deposition, lithography, and etching. FIG. 10, described below, illustrates an example of processing equipment for performing the operations of processes.

Referring to FIG. 3, in the illustrated embodiment, the process 300 involves forming conductive wordlines, at operation 301. The conductive wordlines can be the same as, or similar to, the conductive access lines 206 described above with respect to FIG. 2. Process 300 also involves forming an electrode layer over the conductive wordlines, at operation 302. The conductive electrode layer can include a layer of conductive material that is to be patterned to form electrodes (e.g., bottom electrodes 208 of FIG. 2). Note that when a layer is formed "over" another layer, the stack can include one or more intervening layers. For example, the conductive electrode layer can be disposed directly on the conductive wordlines, or there can be one or more layers (e.g., other conductive layers) between conductive electrode layer and the conductive wordlines. Processing equipment can employ any suitable process for forming the conductive layers for the wordlines and electrodes, such as electroplating, physical vapor deposition (PVD), chemical vapor deposition, or other process for forming conductive layers.

Although the process 300 refers to forming the electrode layer over the conductive wordlines (e.g., over wordlines that are already patterned), another embodiment can involve forming the electrode layer over a wordline layer that is not yet patterned. For example, in one embodiment processing equipment deposits conductive layers for both the wordlines and bottom electrodes, and patterns the conductive layers into wordlines and electrodes with the same processing. Whether or not the conductive electrode layer is formed over already patterned wordlines or an unpatterned wordlines layer, patterning of one or more conductive layers can involve one or more processing steps such as deposition, lithography, etching, or other processing operations. For example, in one embodiment, processing equipment employs a multiple patterning process, such as self-aligned double patterning (SADP) or other multiple patterning process, or any other suitable processes to form of the wordlines and bottom electrodes.

The method also involves forming a layer of selector material doped with dopants, including one or more of aluminum (Al), zirconium (Zr), hafnium (Hf), and silicon (Si), at operation 304. In one embodiment, the selector material includes a chalcogenide glass. In contrast to existing memories, processing equipment forms a layer of doped selector material. The doped selector material can be formed in a variety of ways. For example, in one embodiment, a cosputtering process can be employed to deposit both the selector material and the dopants at the same time. In another embodiment, processing equipment can first deposit a layer of selector material (e.g., via physical vapor deposition (PVD) or another deposition process), and then dope the selector material after deposition (e.g., via a process such as diffusion, ion implantation, sputtering, or another processing technique to dope the selector material. In yet another embodiment, a stack of one or more layers of selector material can be alternated with one or more layers of a dopant, as described in more detail below with respect to FIG. 6A. Regardless of what processing techniques are used to form the layer of doped selector material, the dopant concentration is in a range to reduce or eliminate electromigration in the selector material. For example, in one embodiment, the dopant concentration is in a range of 1-7 at % (atomic percentage, which is the percentage of dopant atoms relative to the selector material atoms).

After forming the layer of doped selector material, the process 300 involves forming another electrode layer over the doped selector material, at operation 306. The electrode layer formed over the selector material can be the same as, or similar to, the middle electrode layer 210 of FIG. 2.

The method also involves forming a layer of storage material doped with dopants including one or more of aluminum (Al), zirconium (Zr), hafnium (Hf), and silicon (Si), at operation 308. In one embodiment, the storage material is a phase change material, such as a chalcogenide material. Similar to the selector material, the layer of doped storage material can be doped in a variety of ways. For example, in one embodiment, a cosputtering process can be employed to deposit both the storage material and the dopants at the same time. In another embodiment, processing equipment can first deposit a layer of storage material (e.g., via physical vapor deposition (PVD) or another deposition process), and then dope the storage material after deposition (e.g., via a process such as diffusion, ion implantation, sputtering, or another processing technique to dope the storage material. In yet another embodiment, a stack of one or more layers of storage material can be alternated with one or more layers of a dopant. Regardless of what processing techniques are used to form the layer of doped selector material, the dopant concentration is in a range to reduce or eliminate volume change and electromigration in the storage material. For example, in one embodiment, the dopant concentration is in a range of 1-7 at % (atomic percentage, which is the percentage of dopant atoms relative to the storage material atoms).

After forming the layer of doped storage material, the process 300 involves forming another electrode layer over the doped phase change material, at operation 310. The electrode layer formed over the selector material can be the same as, or similar to, the top electrode layer 212 of FIG. 2.

The process 300 illustrated in FIG. 3 involves patterning the electrode layers, doped storage material, doped selector material to form separate electrodes, storage elements, and selector element, at operation 312. Patterning the layers can include processing techniques such as deposition and patterning of a mask, and etching through gaps in the patterned mask to pattern the underlying layers. In one embodiment, processing equipment employs a multiple patterning process, such as self-aligned double patterning (SADP) or other multiple patterning process. Different or additional processing operations are also possible.

The process 300 also includes forming conductive bitlines, at operation 314. The bitlines can be the same as, or similar to, the conductive access lines 204 of FIG. 2. In one embodiment, forming the conductive bitlines involves depositing a conductive bitline material and patterning the material.

Although the process 300 illustrates an embodiment in which both the selector and storage materials are doped in accordance with embodiments herein, other embodiments can include only doping the storage material or only doping the selector material, in accordance with embodiments described herein. Thus, the process 300 is one embodiment of a method of forming an array of memory cells with storage and/or selector material that is doped in accordance with embodiments herein.

Figure 4:
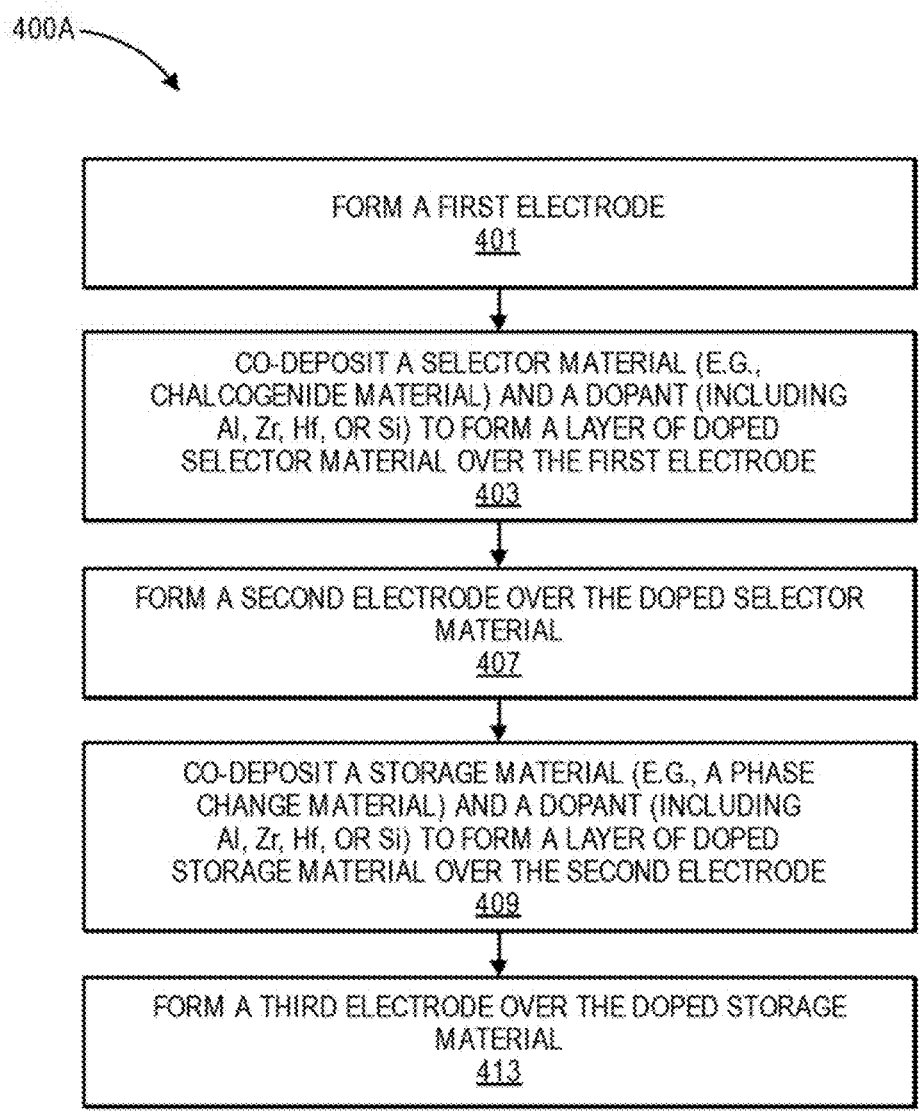
FIG. 4 is a flow diagram of a method of forming a memory cell array with doped layers of selector and storage material, in accordance with embodiments.

FIG. 4 is a flow diagram of a method of forming a memory cell, including forming layers of doped storage and selector material with a technique such as co-sputtering, in accordance with embodiments. Although the process 400 of FIG. 4 illustrates doping both the layers of selector and storage material, other embodiments can include doping only one of a selector material or storage material. For example, in one embodiment, a process of forming a memory cell involves doping the storage material, but not the selector material. In another embodiment, a process of forming a memory cell involves doping the selector material, but not the storage material. In one embodiment in which a memory cell is self-selecting (e.g., a single layer of material acts as both the storage element and also enables selection of the bit), the layer of self-selector material is doped in accordance with embodiments.

Referring again to FIG. 4, the process 400 begins with forming a first electrode, at operation 401. Forming the first electrode can be the same, or similar, as the operation 301 of FIG. 3 to form the bottom electrode. The process then involves forming a layer of doped selector material over the first electrode, at operation 403. The layer of doped selector material can be a chalcogenide material such as a chalcogenide glass and a dopant including one or more of aluminum (Al), zirconium (Zr), hafnium (Hf), and silicon (Si). In the embodiment illustrated in FIG. 4, processing equipment co-deposits the selector material and the dopant, such as with a co-sputtering technique to form the doped selector material. In one such embodiment, the processing equipment can use one or more targets in a physical vapor deposition (PVD) process. For example, in one embodiment, processing equipment performs PVD with a single target that includes both the selector and dopant elements. In another embodiment, the processing equipment performs PVD using multiple targets (e.g., one target for the selector material, and one target for dopant). The processing equipment can also employ multiple cathodes to control the amount of each element deposited by adjusting the power to the system. For some dopants, processing equipment can use a chemical vapor deposition (CVD) process to form the layer of doped selector material. However, PVD can be a less problematic technique for reactive dopants such as aluminum or aluminum oxide.

The method 400 also involves forming a second electrode over the doped selector material, at operation 407. For example, the second electrode can be the same or similar to the middle electrode 210 of FIG. 2.

The process 400 then involves forming a layer of doped storage material over the first electrode, at operation 409. The storage material can be a phase change material, and the dopant can include one or more aluminum (Al), zirconium (Zr), hafnium (Hf), and silicon (Si), in accordance with embodiments. In the illustrated embodiment, processing equipment co-deposits the storage material and the dopant, such as by co-sputtering. Co-deposition of the storage material and dopant can involve similar, or the same, processing techniques as described above with respect to operation 403 to form the layer of doped selector material. For example, processing equipment can perform PVD with one or multiple targets to co-deposit the storage material and the dopant.

After forming the layer of doped storage material, the process 400 involves forming a third electrode over the doped storage material, at operation 413. The third electrode can be the same, or similar to, the top electrode 212 of FIG. 2.

As mentioned above, the process 400 of FIG. 4 is one example of a process flow, but other flows are possible. Additionally, other embodiments can involve forming and processing additional or different layers than illustrated in FIG. 4.

FIGS. 5A-5F illustrate views of a stack of materials during formation of an array of memory cells in accordance with a process, such as the process 400 of FIG. 4, in accordance with an embodiment. Specifically, the view of FIGS. 5A-5F illustrate a cross-sectional view of the array 200 of memory cells of FIG. 2.

Figure 5A:
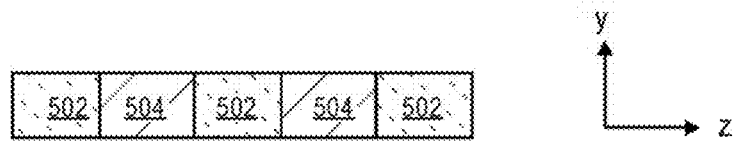
FIGS. 5A-5F illustrate views of a stack of materials during formation of an array of memory cells in accordance with a process, such as the process 400 of FIG. 4, in accordance with an embodiment.

The stack illustrated in FIG. 5A includes patterned access lines 502. The patterned access lines can be the same or similar to the access lines 206 of FIG. 2. The patterned access lines 502 can be referred to as wordlines. Formation of the patterned access lines 206 can involve, for example, deposition of a conductive wordline layer and patterning of the conductive wordline layer. The stack also includes a filler material 504 between the wordlines 502. Processing equipment can deposit the filler material 504 into the gaps between wordlines 502 prior to depositing subsequent layers (e.g., prior to deposition of the electrode layer 506). Filler material 504 can be, for example, a dielectric material such as silicon oxide ($SiO_2$) or other suitable dielectric. The filler material 504 can fill the spaces between the wordlines to provide physical stability to the circuit without significantly interfering with the circuit's operation. In one such embodiment, forming filler material 504 can involve deposition of a dielectric followed by a chemical mechanical planarization (CMP) process that stops on conductive wordlines 502.

Figure 5B:
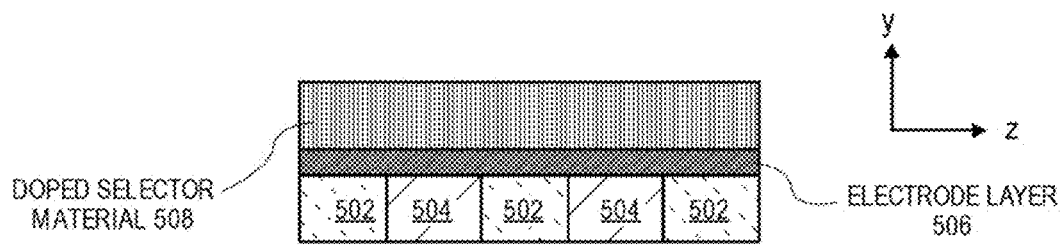

FIG. 5B illustrates the stack of FIG. 5A after forming an electrode layer 506 and layer of doped selector material 508, in accordance with embodiments. The electrode layer 506 can include layer of conductive material, such as the conductive electrode materials described above with respect to FIG. 2. According to embodiments, formation of the electrode layer 506 is later followed by a patterning process to form separate electrodes (e.g., such as in operation 401 of FIG. 4).

In one embodiment, the doped selector material 508 can be a chalcogenide material or other suitable selector material and a dopant including one or more of aluminum (Al), zirconium (Zr), hafnium (Hf), and silicon (Si). In the embodiment illustrated in FIG. 5B, processing equipment co-deposits the selector material and dopant (e.g., such as in operation 403 of FIG. 4). For example, processing equipment can perform PVD with one or more targets including both the elements for forming the selector material and the dopant. However, the doped selector material 508 can also be formed by deposition of the selector material followed by other processing operations to dope the selector material after deposition.

Figure 5C:
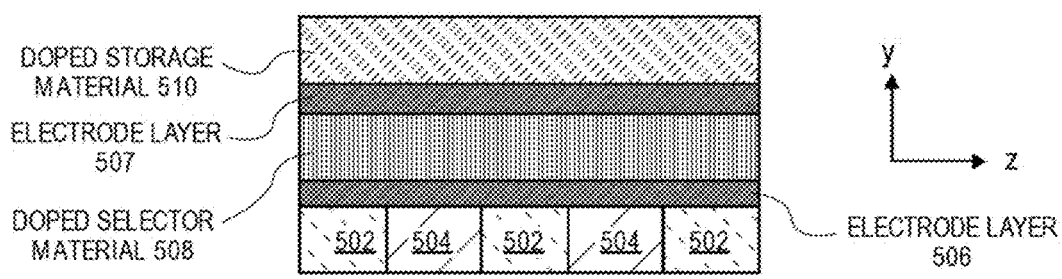

FIG. 5C illustrates the stack of FIG. 5B after deposition of another electrode layer 507 and a layer of storage material 510, in accordance with embodiments. The electrode layer 507 can include a layer of conductive material, such as the conductive electrode materials described above with respect to FIG. 2. According to embodiments, formation of the electrode layer 507 is later followed by a patterning process to form separate electrodes (e.g., such as in operation 407 of FIG. 4).

In one embodiment, the doped storage material 510 can include a phase change material or other suitable material with memory effects for storing a logic value, and a dopant including one or more of aluminum (Al), zirconium (Zr), hafnium (Hf), and silicon (Si). In the embodiment illustrated in FIG. 5C, processing equipment co-deposits the storage material and dopant (e.g., such as in operation 409 of FIG. 4). For example, processing equipment can perform PVD with one or more targets including both the elements for forming the storage material and the dopant. However, the doped storage material 510 can also be formed by deposition of the storage material followed by other processing operations to dope the storage material after deposition.

Figure 5D:
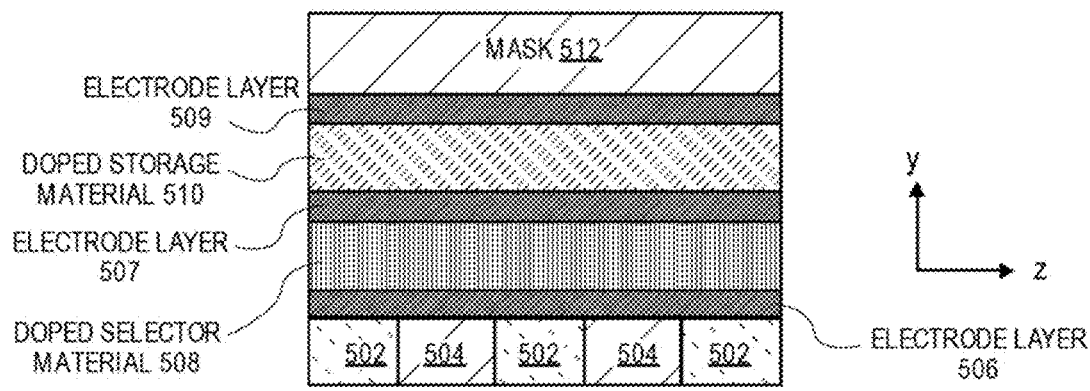

FIG. 5D illustrates the stack of FIG. 5C after deposition of another electrode layer 509 and a mask layer 512, in accordance with embodiments. Like the previously formed electrode layers 506 and 507, the electrode layer 509 can include a layer of conductive material such as describe above with respect to FIG. 2. According to embodiments, formation of the electrode layer 509 is later followed by a patterning process to form separate electrodes (e.g., such as in operation 413 of FIG. 4). The mask 512 can be, for example, a dielectric hard mask, or other suitable mask. Processing equipment can then form a photoresist pattern over the mask 512 to create a patterned mask. Processing equipment can then etch the underlying stack through the openings in the patterned mask to obtain a patterned stack as illustrated in FIG. 5E.

Figure 5E:
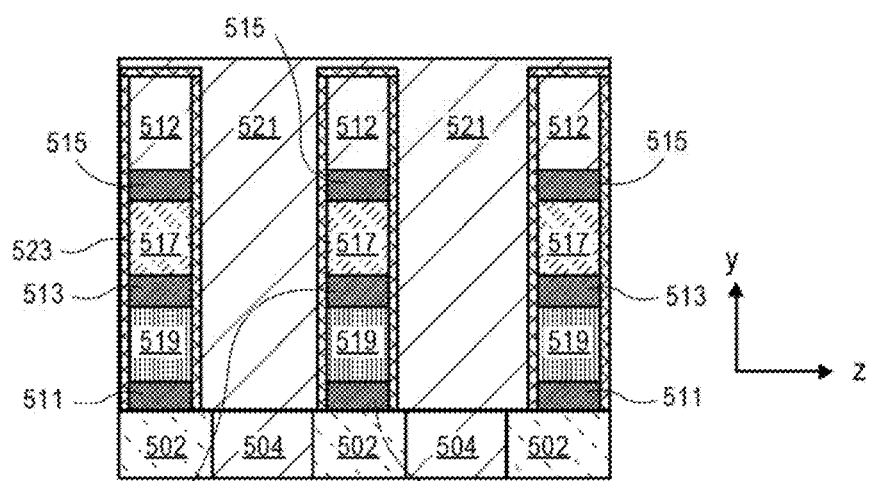

FIG. 5E illustrates the stack of FIG. 5D after patterning the stack and depositing of a sealing material 523 and filling material 521, in accordance with embodiments. In the illustrated embodiment, processing equipment etches the stack (the electrodes layers 506, 507, 509, the doped selector material 508, and the doped storage material 510) to define individual memory cells. In one embodiment, a memory cell includes a bottom electrode 511, a doped selector element (which can also be referred to as a selector device) 519, a middle electrode 513, a doped storage element 517, and a top electrode 515. After etching the stack, processing equipment can deposit a sealing material 523. In one embodiment, sealing material 523 can be, for example: silicon oxides, silicon nitrides, silicon oxynitrides, other oxides (such as alumina, hafnium oxides, titanium oxides, zirconium oxides), high-k materials, non-conductive nitrides, or other materials capable of acting as a sealing material. Sealing material 523 can function as an insulator and/or chemical barrier to electrically insulate different structures and protect materials from contamination. In one such embodiment, processing equipment deposits, masks, and etches the sealing material 523 to surround the sides of the electrodes, storage material, and selector material. Processing equipment then deposits filler material 521 between the individual memory cells. Filler material 521 can be composed of the same or similar materials as filler material 504, described above. In one embodiment, processing equipment deposits sealing material 523 and filler material 521 as conformal layers. In one embodiment, the thickness of a conformal layer is approximately the same along the entire interface with the underlying layer. However, in other embodiments, sealing material 523 and filler material 521 can be nonconformal layers. After depositing sealing material 523 and filler material 521, in one embodiment, processing equipment performs a CMP operation on sealing material 523 and filler material 521, stopping on conductive electrodes 515 to expose the electrodes 515 for formation of the bitlines.

Figure 5F:
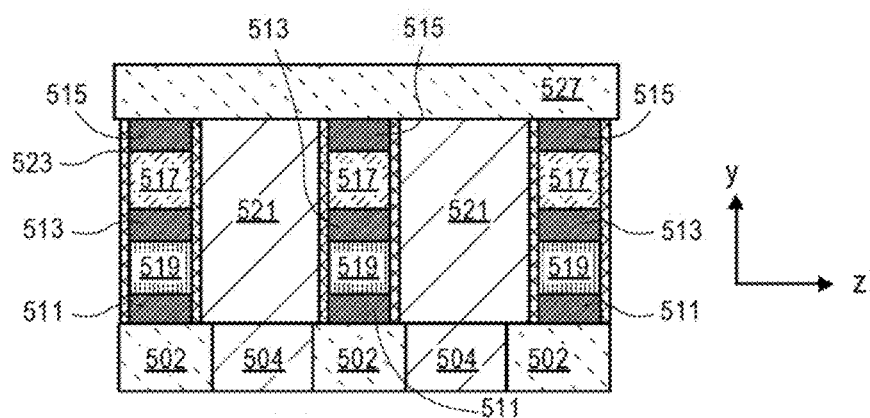

FIG. 5F illustrates the stack of FIG. 5E after formation of conductive access lines 527, in accordance with embodiments. Conductive access lines 527 can be composed of the same or similar materials as the conductive access lines 502, in accordance with embodiments. Processing equipment can form the conductive access lines 527 by depositing a layer of conductive material and patterning the material into conductive bitlines that are orthogonal to conductive wordlines 502. Note that in the illustrated embodiment, only a single bitline is visible because of the direction of the cross-sectional view.

Thus, FIGS. 4 and 5A-5F illustrate a process of forming a memory cell with a doped storage material and/or selector. Doping the storage and selector material in accordance with embodiments described above can minimize or eliminate volume changes and electro-migration.

Figure 6A:
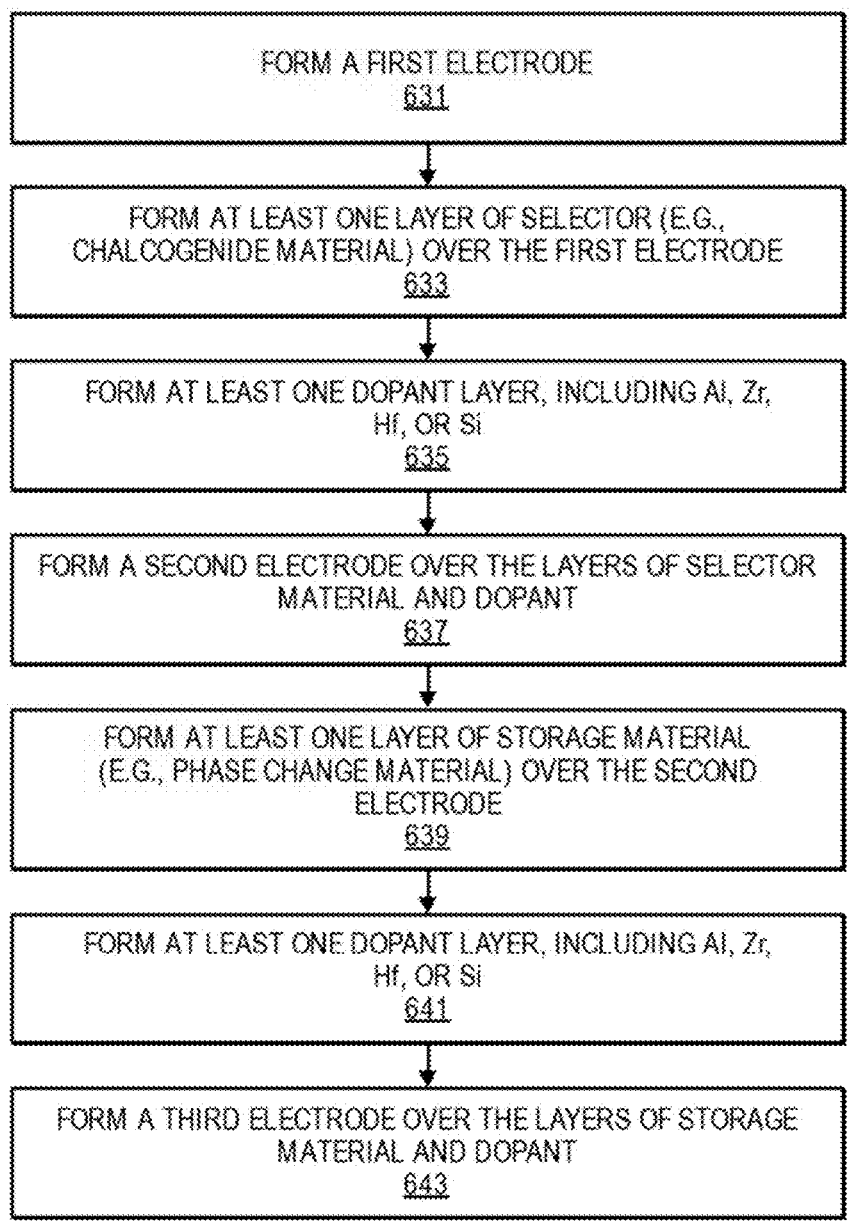
FIG. 6A is a flow diagram of a method of forming a memory cell array with a doped layers of selector and storage material, in accordance with embodiments.

FIG. 6A is a flow chart of a method of forming a memory cell, including the formation of one or more alternating layers of storage material and a dopant, in accordance with embodiments. Although the process 600 of FIG. 6A illustrates doping both the layers of selector and storage material, other embodiments can include doping only one of a selector material or storage material. In one embodiment in which a memory cell is self-selecting (e.g., a single layer of material acts as both the storage element and also enables selection of the bit), the layer of self-selector material is doped in accordance with embodiments.

Referring again to FIG. 6A, the process 600 begins with forming a first electrode, at operation 631. Forming the first electrode can be the same, or similar, as the operation 301 of FIG. 3 to form the bottom electrode. The process then involves forming one or more layers of a selector material and one or more layers of a dopant, at operations 633 and 635. According to embodiments, the dopant layer(s) can be thin films (lamina) of a dopant including one or more of aluminum (Al), zirconium (Zr), hafnium (Hf), and silicon (Si). Dopant thin films can include, for example, films of a dopant having a thickness in a range of 0.5 nm-5 nm. In one such embodiment, processing equipment can deposit the thin dopant film onto the stack in the desired order via processing techniques such as physical vapor deposition (PVD), atomic layer deposition (ALD), chemical vapor deposition (CVD), or another suitable technique. In one embodiment, the layer of selector material is a chalcogenide material, such as a chalcogenide glass, and is formed by any suitable deposition process such as physical vapor deposition (PVD), chemical vapor deposition (CVD), atomic layer deposition (ALD), or another deposition technique.

Figure 6B:
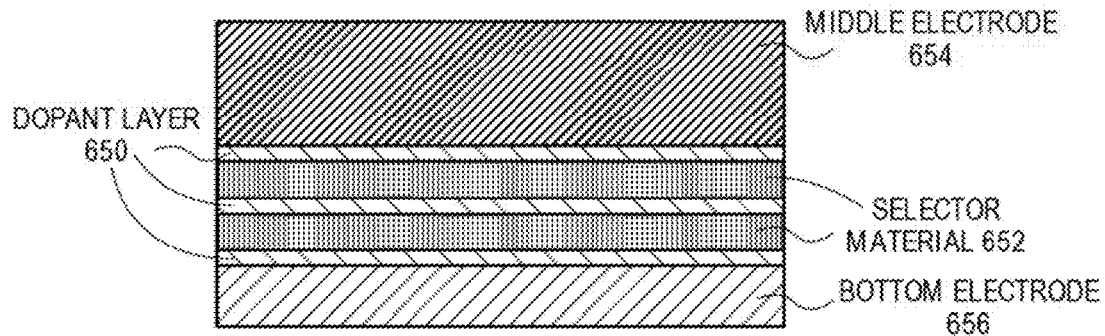
FIGS. 6B-6F illustrate examples of different numbers of dopant lamina layers with different placements, in accordance with embodiments.
Figure 6C:
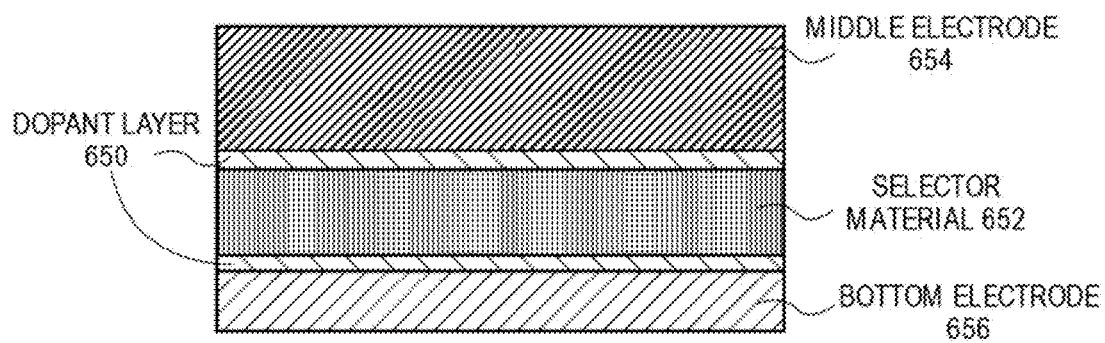
Figure 6D:
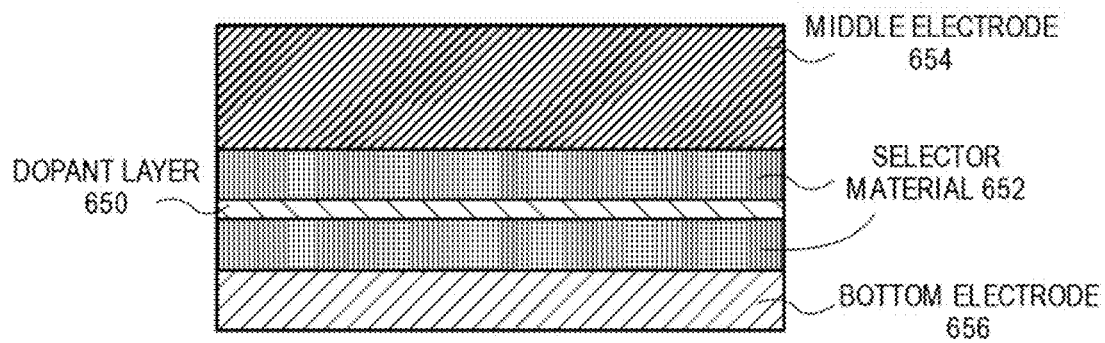
Figure 6E:
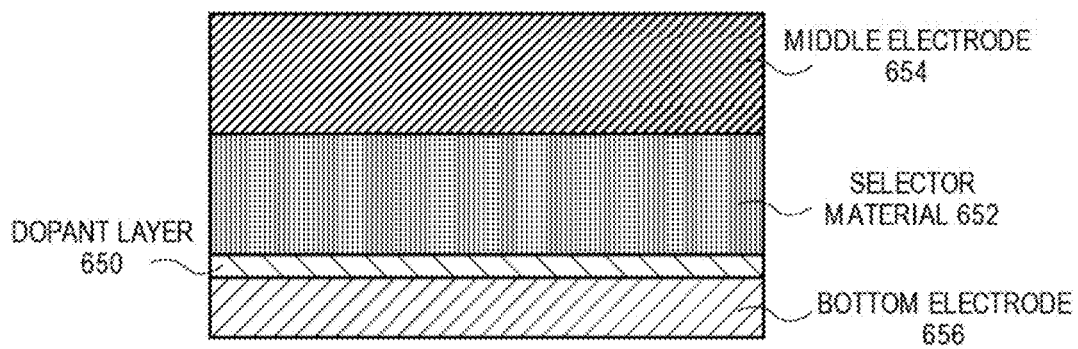
Figure 6F:
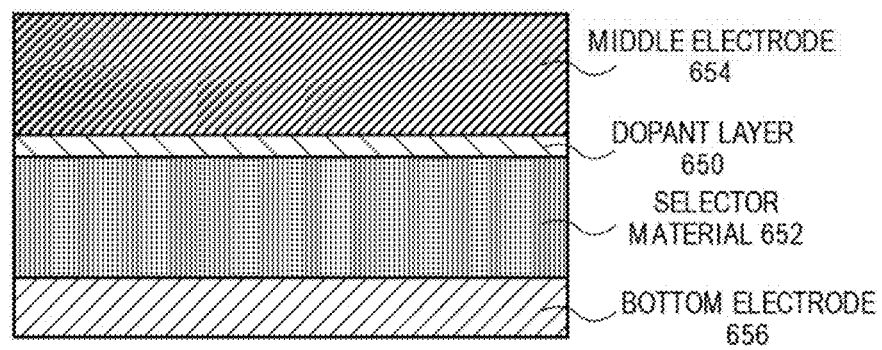

According to embodiments, process 600 can involve forming different numbers of dopant layers and with different placements relative to the selector material. FIGS. 6B-6F illustrate examples of different numbers of dopant lamina layers with different placements, in accordance with embodiments. For example, FIG. 6B illustrates an embodiment with three dopant layers 650. In FIG. 6B, one dopant layer 650 is located between the bottom electrode 656 and a layer of selector material 652, a second dopant layer 650 is located between the middle electrode 654 and a layer of selector material 652, and a third dopant layer 650 is located in the middle of two layers of selector material 652. FIG. 6C illustrates an embodiment with two dopant layers 650. In FIG. 6C, a layer of selector material 652 is located between two dopant layers 650. Other embodiments can include a single dopant layer. For example, FIG. 6D illustrates an embodiment in which a single dopant layer 650 is sandwiched between two layers of selector material 652. FIG. 6E illustrates an embodiment in which a layer of selector material is located between the bottom electrode 656 and the selector material 652. FIG. 6F illustrates an embodiment in which a dopant layer 650 is located between the middle electrode and the selector material. Other embodiments can include more than three dopant layers interleaved with the selector material. The number of dopant layers depends on the desired amount or concentration of dopant, in accordance with embodiments. Upon initially forming the dopant layer(s) and layer(s) of selector material, the layers are separate and discrete from one another. However, the elements in the layers of selector material and dopant layers will intermix to from a uniformly doped selector. For example, the layers of selector material and dopant layers can reach a temperature (e.g., in a range of 280-300° C.) to cause intermixing of the elements as a result of other processing operations (such as deposition of a mask prior to patterning), which results in a layer of uniformly doped selector material. However, a separate annealing operation can also be performed to cause intermixing of elements in the dopant layer(s) and the layer(s) of selector material.

Referring again to FIG. 6A, after forming the layer(s) of dopant and selector material, the process involves forming a second electrode, at operation 637. The second electrode can be the same or similar to the middle electrode 210 of FIG. 2.

A similar process can be performed to form a doped layer of storage material. For example, processing equipment can form one or more dopant layers (including one or more of aluminum (Al), zirconium (Zr), hafnium (Hf), and silicon (Si)) and one or more layers of storage material, at operations 639 and 641. Similar to the layers of dopant and selector material described above, embodiments can include one, two, three, or more layers of dopant. The number and placement of dopant layers illustrated in FIGS. 6B-6F are also applicable to formation of the layer of doped storage material, in accordance with embodiments. Upon initially forming the dopant layer(s) and layer(s) of storage material, the layers are separate and discrete from one another. However, the elements in the layers of storage material and dopant layers will intermix to from a layer of uniformly doped storage material. For example, the layers of storage material and dopant layers can reach a temperature (e.g., in a range of 280-300° C.) to cause intermixing of the elements as a result of other processing operations (such as deposition of a mask prior to patterning), which results in a layer of uniformly doped storage material. However, a separate annealing operation can also be performed to cause intermixing of elements in the dopant layer(s) and the layer(s) of storage material. The process 600 also involves forming a third electrode over the doped storage material, at operation 643. The third electrode can be the same, or similar to, the top electrode 212 of FIG. 2.

The process 600 of FIG. 6A is one example of a process flow, but other flows are possible. Additionally, other embodiments can involve forming and processing additional or different layers than illustrated in FIG. 6A.

FIGS. 7A-7F illustrate views of a stack of materials during formation of an array of memory cells in accordance with a process, such as the process 600 of FIG. 6A, in accordance with an embodiment. Specifically, the view of FIGS. 7A-7F illustrate a cross-sectional view of a memory cell array that is similar to the array 200 of memory cells of FIG. 2, but with multiple layers of dopants interleaved with the storage material and selector material.

Figure 7A:
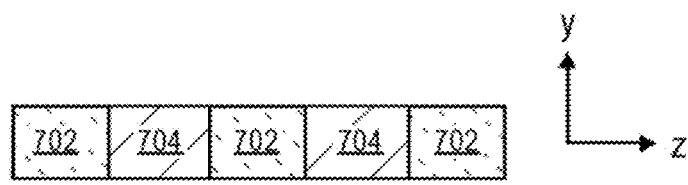
FIGS. 7A-7F illustrate views of a stack of materials during formation of an array of memory cells in accordance with a process, such as the process 600 of FIG. 6A, in accordance with an embodiment.

The stack illustrated in FIG. 7A includes patterned access lines 702. The patterned access lines can be the same or similar to the access lines 206 of FIG. 2. The patterned access lines 702 can be referred to as wordlines. Formation of the patterned access lines 702 can involve, for example, deposition of a conductive wordline layer and patterning of the conductive wordline layer. The stack also includes a filler material 704 between the wordlines 502. The filler material can be the same as, or similar to, the filled material 504 of FIG. 5A.

Figure 7B:
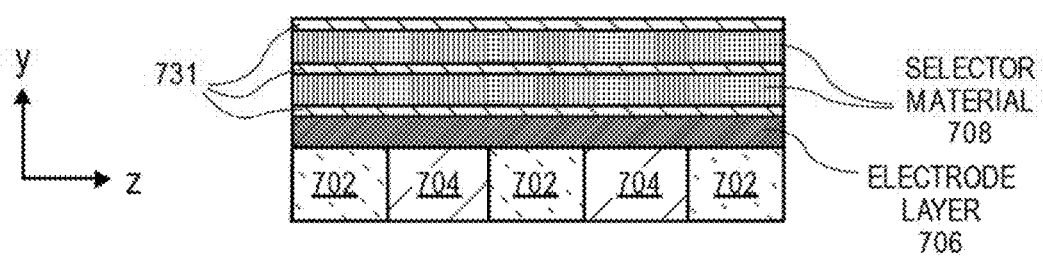

FIG. 7B illustrates the stack of FIG. 7A after forming an electrode layer 706 and multiple layers of selector material 708 and multiple dopant layers 731, in accordance with embodiments. The electrode layer 706 can include a layer of conductive material, such as the conductive electrode materials described above with respect to FIG. 2. According to embodiments, formation of the electrode layer 706 is later followed by a patterning process to form separate electrodes (e.g., such as in operation 631 of FIG. 6A). In one embodiment, the selector material 708 can be a chalcogenide material or other suitable selector material. The dopant layers 731 can be one of aluminum (Al), zirconium (Zr), hafnium (Hf), and silicon (Si)). In one such embodiment, the dopant layers include an oxide or nitride. In the embodiment illustrated in FIG. 7B, the stack includes three layers of dopant and two layers of selector material in an alternating configuration, such as in FIG. 6B.

Figure 7C:
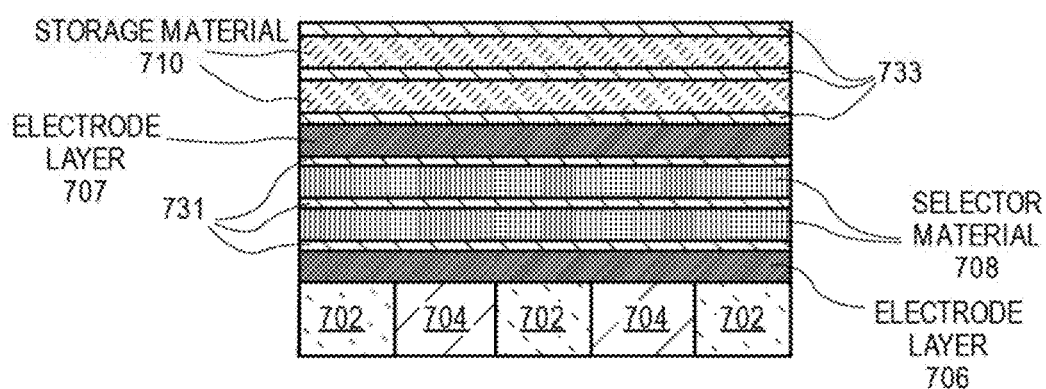

FIG. 7C illustrates the stack of FIG. 7B after deposition of another electrode layer 707 and multiple layers of storage material 710 and multiple dopant layers 733, in accordance with embodiments. The electrode layer 507 can include a layer of conductive material, such as the conductive electrode materials described above with respect to FIG. 2. According to embodiments, formation of the electrode layer 707 is later followed by a patterning process to form separate electrodes (e.g., such as in operation 637 of FIG. 6A). In one embodiment, the storage material 710 can be a phase change material or other suitable material with memory effects for storing a logic value. The dopant layers 733 can include one or more of aluminum (Al), zirconium (Zr), hafnium (Hf), and silicon (Si)), and can be the same as, or similar to, the dopant layers 731. In one such embodiment, the dopant layers include an oxide or nitride. In the embodiment illustrated in FIG. 7C, the stack includes three layers of dopant and two layers of storage material in an alternating configuration, such as in FIG. 6B.

Figure 7D:
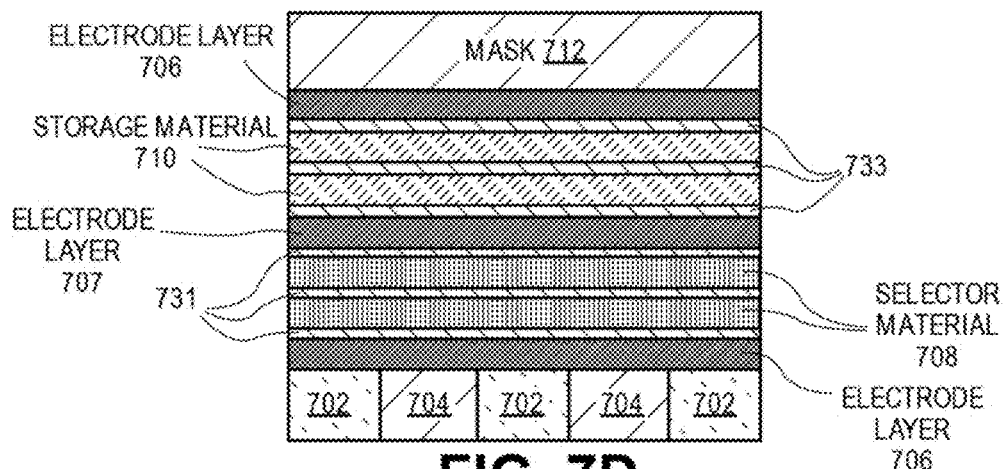

FIG. 7D illustrates the stack of FIG. 7C after deposition of another electrode layer 509 and a mask layer 512, in accordance with embodiments. Like the previously formed electrode layers 706 and 707, the electrode layer 709 can include a layer of conductive material such as describe above with respect to FIG. 2. The mask 712 can be, for example, a dielectric hard mask, or other suitable mask. In the process of depositing the mask 712, the stack of materials can become heated to a temperature that is sufficient to cause intermixing of the elements in the dopant and selector/storage material layers. Thus, a uniform doped layer of storage and/or selector material can be formed from discrete layers without requiring an additional annealing operation, in accordance with embodiments. Processing equipment can then form a photoresist pattern over the mask 512 to create a patterned mask. Processing equipment can then etch the underlying stack through the openings in the patterned mask to obtain a patterned stack as illustrated in FIG. 7E.

Figure 7E:
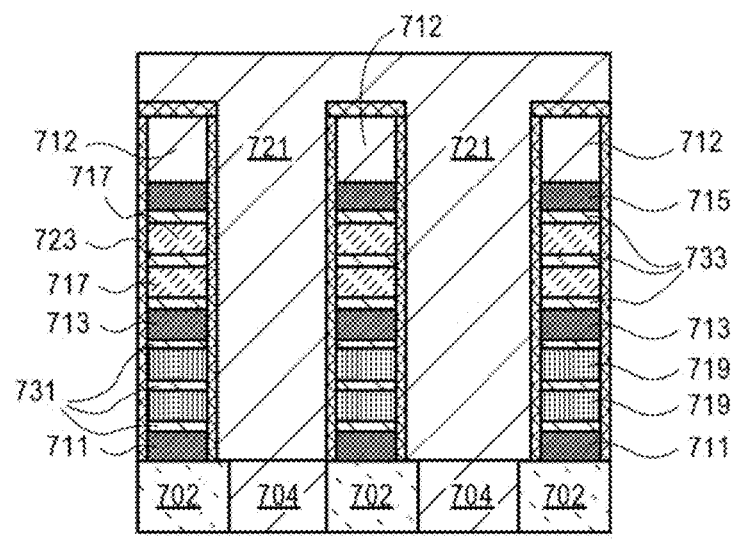

FIG. 7E illustrates the stack of FIG. 7D after patterning the stack and deposition of a sealing and filling material, in accordance with embodiments. In the illustrated embodiment, processing equipment etches the stack (the electrodes layers 706, 707, 709, the layers of selector material 708, the dopant layers 731, the layers of storage material 710, and dopant layers 733) to define individual memory cells. In one embodiment, a memory cell includes a bottom electrode 711, a doped selector element (formed from the intermixing of selector material 719 and dopants 731), a middle electrode 713, a doped storage element (formed from the intermixing of storage material 717 and dopants 733), and a top electrode 715. After etching the stack, processing equipment can deposit a sealing material 723 and a filler material 721. The sealing material 723 and filler material 721 can be in accordance with the sealing material 523 and filler material 521 of FIG. 5E. After depositing the sealing material 723 and filer material 721, processing equipment can perform a CMP operation on sealing material 723 and filler material 721, stopping on conductive electrodes 715 to expose the electrodes 715 for formation of the bitlines. As mentioned above, as the result of processing the stack, the dopant layers intermix with the selector and/or storage material. Thus, although the dopant layers 731 and 733 are shown as discrete layers in FIG. 7E, the dopants may have already intermixed with the selector and/or storage materials at this point in the process.

Figure 7F:
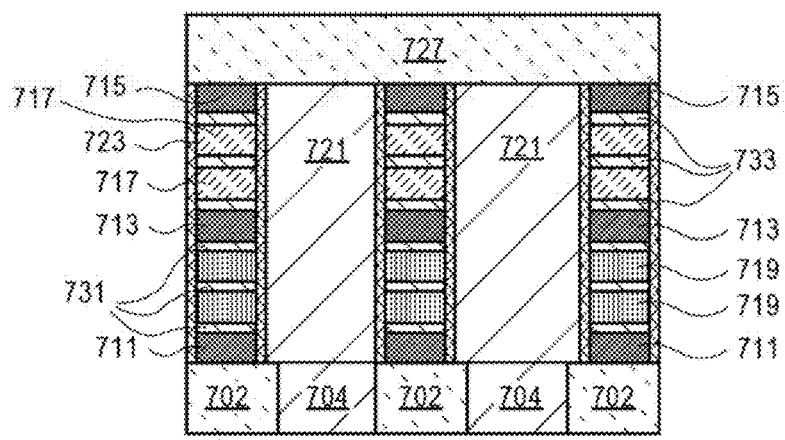

FIG. 7F illustrates the stack of FIG. 7E after formation of the conductive access lines 727, in accordance with embodiments. Conductive access lines 727 can be composed of the same or similar materials as the conductive access lines 702, in accordance with embodiments. Processing equipment can form the conductive access lines 727 by depositing a layer of conductive material and patterning the material into conductive bitlines that are orthogonal to conductive wordlines 702. Note that in the illustrated embodiment, only a single bitline is visible because of the direction of the cross-sectional view. Additionally, although the dopant layers 731 and 733 are shown as discrete layers in FIG. 7F, the dopants may have already intermixed with the selector and/or storage materials at this point in the process.

Thus, FIGS. 6A and 7A-7F illustrate a process of forming a memory cell with a doped storage material and/or selector. Doping the storage and selector material in accordance with embodiments described above can minimize or eliminate volume changes and electro-migration.

Figure 8A:
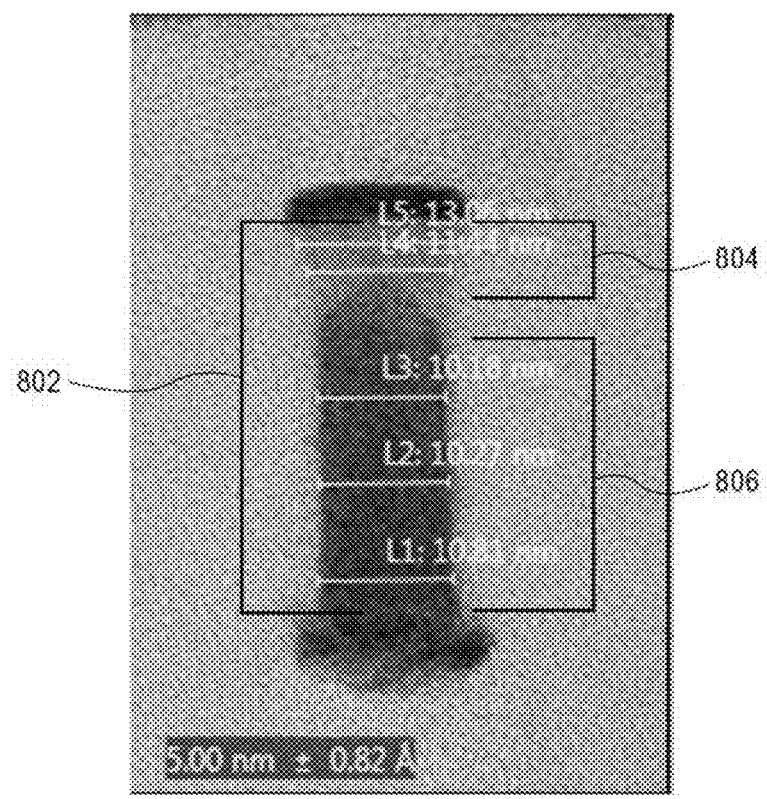
FIGS. 8A and 8B are transmission electron microscope (TEM) images illustrating partially set storage elements for a memory cell with and without doping of the storage elements, in accordance with an embodiment.
Figure 8B:
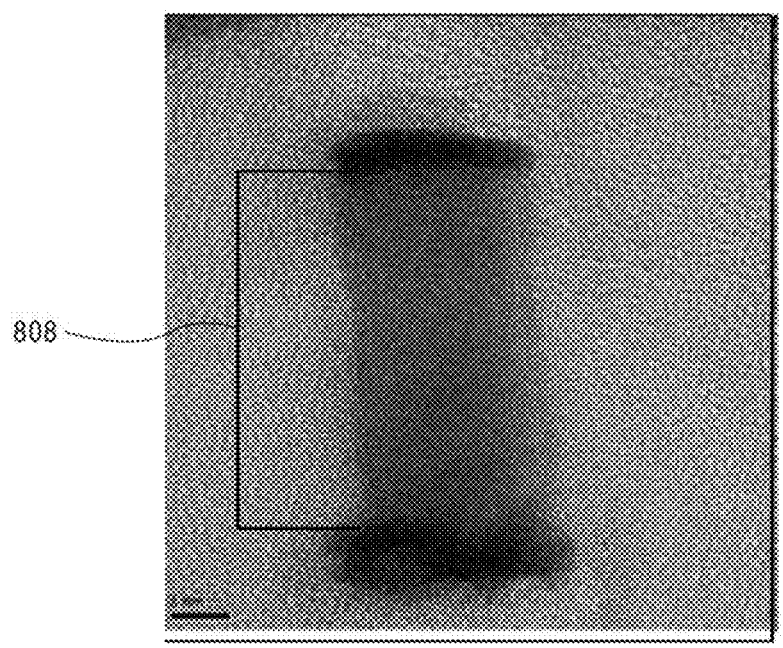

FIGS. 8A and 8B are transmission electron microscope (TEM) images illustrating partially set storage elements for a memory cell with and without doping of the storage elements, in accordance with an embodiment. FIG. 8A illustrates an image of part of a memory cell that does not have a doped storage material. The storage element 802 is partially set (as opposed to completely set to a given logic state) such that part of the storage material is in an amorphous state (amorphous part 804) and part of the storage material is in a crystalline state (crystalline part 806). As can be seen in FIG. 8A, the amorphous part 804 is significantly wider than the crystalline part 806. As explained above, the continuous volume change associated with programming a bit can cause significant strain to the memory cell and eventually result in failure.

FIG. 8B illustrates an image of part of a memory cell that that has a storage material that is doped with aluminum, in accordance with embodiments. The memory cell in FIG. 8B is also partially set, but unlike the memory cell in FIG. 8A, there is no difference in width of the storage material 808.

Figure 9A:
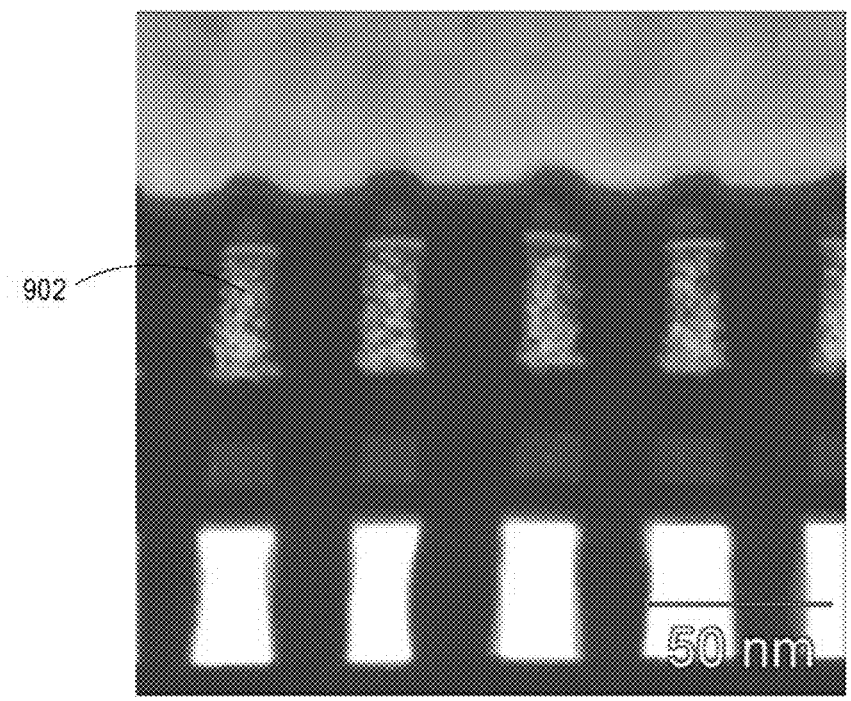
FIGS. 9A and 9B are transmission electron microscope (TEM) images illustrating arrays of memory cells with and without doping of the selector elements, in accordance with embodiments.
Figure 9B:
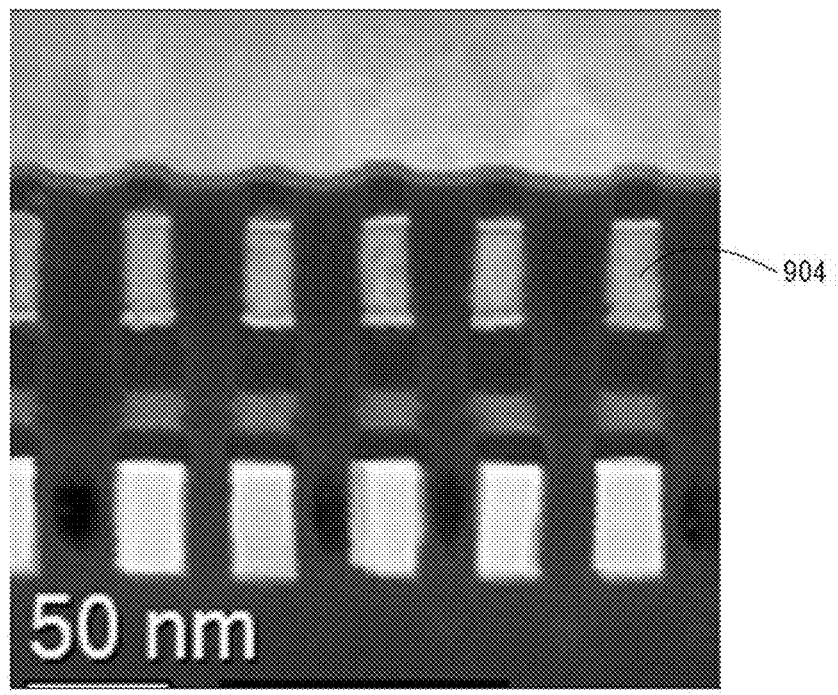

FIGS. 9A and 9B are transmission electron microscope (TEM) images illustrating arrays of memory cells with and without doping of the selector elements, in accordance with embodiments. FIG. 9A is an image of part of a memory array without a doped selector material. The image in FIG. 9A shows that electro-migration of the elements in the selector material 902 occurs after a relatively small number of programming cycles. Specifically, FIG. 9A shows the elemental segregation of antimony and tellurium. In contrast, FIG. 9B is an image of part of a memory array with a selector material doped with aluminum. As can be seen in FIG. 9B, the memory cells with the doped selectors 904 appear significantly more uniform due to the lack of electro-migration.

FIG. 10 is a block diagram of exemplary processing equipment for fabricating a memory cell array in accordance with embodiments described herein. Processing equipment 1000 can include tools to perform materials processing operations such as deposition, etching (e.g., wet or dry etching, laser etching, or other etch processes), ion implantation, chemical mechanical planarization (CMP), annealing, curing, cleaning, and/or other materials processing operations. As illustrated, processing equipment 1000 includes a deposition tool 1002, in accordance with embodiments. Although one deposition tool 1002 is illustrated, other embodiments can include more than one deposition tool. Deposition tool 1002 can include, for example, equipment to perform chemical vapor deposition (CVD), atomic layer deposition (ALD), physical vapor deposition (PVD) such as physical sputtering, plasma-enhanced chemical vapor deposition (PECVD), hybrid physical chemical vapor deposition (HPCVD), or other deposition techniques. Deposition tool 1002 can deposit one or more of the layers described herein to form a memory cell array. Processing equipment 1000 can also include an electroplating tool 1008 to form conductive layers via an electroplating or electrodeposition process.

Processing equipment 1000 also includes an etch tool or chamber 1004, for example, a wet or dry etch tool. Wet etching can involve, for example, immersing the substrate being processed in a wet etchant, or other wet etching technique. Dry etching can involve, for example, the removal of material by exposing the substrate to bombardment of ions (e.g., via a plasma of reactive gases) that dislodge portions of the material from surfaces of the substrate that are exposed to the ions. Although one etch tool 1004 is illustrated, other embodiments can include more than one etch tool. Etch tool 1004 can perform etching or patterning operations of methods described herein.

Processing equipment 1000 also includes lithography tool 1006. Lithography tool 1006 can use light to transfer a pattern from a photomask to a light-sensitive chemical "photoresist" on the substrate. Subsequent operations, such as chemical treatments, can then etch the pattern into the material under the photoresist, or enable deposition of a new material in the pattern. Processing equipment also includes an annealing and/or curing tool 1007. Annealing/curing tool 1007 can include a furnace or other heating mechanism to anneal or cure layers on a substrate.

Processing equipment also includes CMP tool 1009. CMP tool 1009 can perform chemical mechanical planarization operations by using, for example, a chemical slurry to planarize a surface of a substrate. The tools of processing equipment can be combined into a single tool, can be separate tools. In another embodiment, some tools are combined while others are separate. Robotic transfer mechanisms 1010 can transfer the substrate or wafer being processed amongst tools.

Processing equipment includes control logic to operate the equipment and control parameters of the process. In one embodiment, each tool includes its own control logic. The control logic can include hardware logic and/or software/firmware logic to control the processing. The equipment can be programmed or configured to perform certain operations in a certain order. For example, a manufacturing entity can configure processing equipment 1000 to perform operations on a wafer or substrate to form electronic circuits. The processing equipment can also include other components of a computer system, such one or more components of system 1100 of FIG. 11. For example, in one embodiment, processing equipment can include one or more displays and input devices for managing the processing equipment. A manufacturing entity typically operates the processing equipment.

Figure 11:
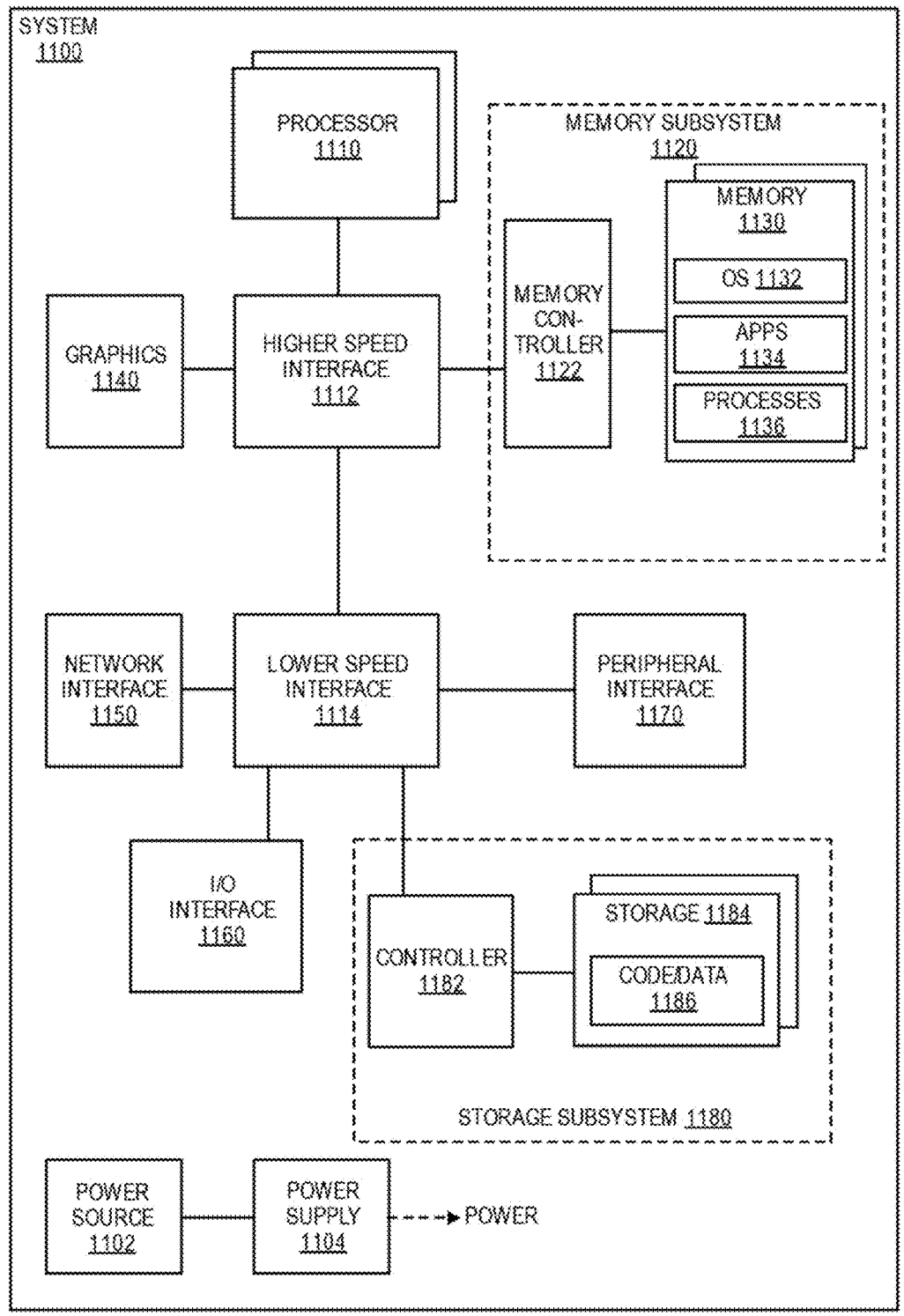
FIG. 11 is a block diagram of a computing system in which a memory with a doped storage or selector material can be included, in accordance with an embodiment.

FIG. 11 is a block diagram of a computing system in which a memory device having doped storage and/or selector materials can be included, in accordance with an embodiment.

System 1100 represents a computing device in accordance with any embodiment described herein, and can be a laptop computer, a desktop computer, a server, a gaming or entertainment control system, a scanner, copier, printer, routing or switching device, embedded computing device, or other electronic device.

System 1100 includes processor 1110, which provides processing, operation management, and execution of instructions for system 1100. Processor 1110 can include any type of microprocessor, central processing unit (CPU), graphics processing unit (GPU), processing core, or other processing hardware to provide processing for system 1100, or a combination of processors. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1100 includes interface 1112 coupled to processor 1110, which can represent a higher speed interface or a high throughput interface for system components that needs higher bandwidth connections, such as memory subsystem 1120 or graphics interface components 1140. Interface 1112 can represent a "north bridge" circuit, which can be a standalone component or integrated onto a processor die. Graphics interface 1140 interfaces to graphics components for providing a visual display to a user of system 1100. In one embodiment, graphics interface 1140 generates a display based on data stored in memory 1130 or based on operations executed by processor 1110 or both.

Memory subsystem 1120 represents the main memory of system 1100, and provides storage for code to be executed by processor 1110, or data values to be used in executing a routine. Memory subsystem 1120 can include one or more memory devices 1130 such as read-only memory (ROM), flash memory, one or more varieties of random access memory (RAM), or other memory devices, or a combination of such devices. Memory devices 1130 can include memory devices with doped storage and/or selector elements as described herein.

Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide logic to provide functions for system 1100. In one embodiment, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1100 includes interface 1114, which can be coupled to interface 1112. Interface 1114 can be a lower speed interface than interface 1112. In one embodiment, interface 1114 can be a "south bridge" circuit, which can include standalone components and integrated circuitry. In one embodiment, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, USB (universal serial bus), or other wired or wireless standards-based or proprietary interfaces. Network interface 1150 can exchange data with a remote device, which can include sending data stored in memory or receiving data to be stored in memory.

In one embodiment, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one embodiment, system 1100 includes storage subsystem 1180 to store data in a nonvolatile manner. In one embodiment, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one embodiment, storage subsystem 1180 includes controller 1182 to interface with storage 1184. In one embodiment controller 1182 is a physical part of interface 1114 or processor 1110, or can include circuits or logic in both processor 1110 and interface 1114.

Power source 1102 provides power to the components of system 1100. More specifically, power source 1102 typically interfaces to one or multiple power supplies 1104 in system 1100 to provide power to the components of system 1100. In one embodiment, power supply 1104 includes an AC to DC (alternating current to direct current) adapter to plug into a wall outlet. Such AC power can be renewable energy (e.g., solar power) power source 1102. In one embodiment, power source 1102 includes a DC power source, such as an external AC to DC converter. In one embodiment, power source 1102 or power supply 1104 includes wireless charging hardware to charge via proximity to a charging field. In one embodiment, power source 1102 can include an internal battery or fuel cell source.

Some embodiments of the disclosure follow. In one embodiment, a circuit includes an array of memory cells, and a given memory cell of the array includes a first electrode and a second electrode, and a storage element comprising a layer of doped phase change material between the first and second electrodes, wherein the doped phase change material includes aluminum. In one embodiment, the layer of doped phase change material includes aluminum oxide (e.g., $Al_2O_3$) or aluminum nitride (AlN). In another embodiment, the doped phase change material includes zirconium (Zr). In one such embodiment, the d doped phase change material includes a zirconium oxide (e.g., $ZrO_2$) or zirconium nitride (e.g., ZrN). In another embodiment, the doped phase change material includes hafnium (Hf). In one such embodiment, the doped phase change material includes a hafnium oxide (e.g., $HfO_2$) or hafnium nitride (e.g., HfN). In another embodiment, the doped phase change material includes silicon (Si). In one such embodiment, the doped phase change material includes silicon oxide (e.g., $SiO_2$) or silicon nitride (e.g., $Si_3N_4$). In one embodiment, the doped phase change material has a dopant concentration in a range of 1-7 at %. In one embodiment, the doped phase change material comprises a solid solution of a chalcogenide material and a dopant (e.g., a dopant containing aluminum, zirconium, hafnium, or silicon).

In one embodiment, the memory cell further includes a selector element between the storage element and one of the first and second electrodes, wherein the selector element includes a doped chalcogenide material. In one such embodiment, the doped chalcogenide material of the selector element has a dopant concentration in a range of 1-7 at %. In one embodiment, the doped chalcogenide material of the selector element comprises a solid solution of a chalcogenide material and a dopant.

In one embodiment, the doped chalcogenide material of the selector element includes aluminum (Al). In one embodiment, the doped chalcogenide material of the selector element includes a aluminum oxide (e.g., $Al_2O_3$) or aluminum nitride (AlN). In another embodiment, the doped chalcogenide material of the selector element includes zirconium (Zr). In one such embodiment, the doped chalcogenide material of the selector element includes a zirconium oxide (e.g., $ZrO_2$) or zirconium nitride (e.g., ZrN). In another embodiment, the doped chalcogenide material of the selector element includes hafnium (Hf). In one such embodiment, the doped chalcogenide material of the selector element includes a hafnium oxide (e.g., $HfO_2$) or hafnium nitride (e.g., HfN). In another embodiment, the doped chalcogenide material of the selector element includes silicon (Si). In one such embodiment, the doped chalcogenide material of the selector element includes silicon oxide (e.g., $SiO_2$) or silicon nitride (e.g., $Si_3N_4$).

In one embodiment, the storage element has a same width in an amorphous and crystalline state. In one embodiment, the crystallization temperature of the doped phase changed material of the storage element is in a range of 150-300 degrees Celsius (C).

In one embodiment a circuit includes an array of memory cells, wherein a given memory cell of the array includes a first electrode and a second electrode, a storage element comprising a layer of doped phase change material between the first and second electrodes, and a selector element between the storage element and one of the first and second electrodes, wherein the selector element includes a doped chalcogenide material. In one embodiment, the doped phase change material and the doped chalcogenide material have dopant concentrations in a range of 1-7 at %. In one embodiment, the doped phase change material of the storage element and the doped chalcogenide material of the selector element include solid solutions of a chalcogenide material and a dopant. In one embodiment, the doped chalcogenide material of the selector element and the doped phase change material of the storage element include one of: silicon (Si), zirconium (Zr), hafnium (Hf), and silicon (Si). In one such embodiment, the doped chalcogenide material of the selector element and the doped phase change material of the storage element include a dopant including an oxide or a nitride. In one embodiment, the doped chalcogenide material of the selector element includes an aluminum-doped chalcogenide glass including antimony, and the selector element includes a uniform distribution of antimony. In one embodiment, the storage element has a same width in an amorphous and crystalline state. In one embodiment, the crystallization temperature of the doped phase changed material of the storage element in a range of 150-300 C.

In one embodiment, a system includes a processor and a memory device communicatively coupled with the processor, wherein the memory device includes an array of memory cells in accordance with an embodiment herein. In one embodiment, the system further includes any of a display communicatively coupled to the processor, a network interface communicatively coupled to the processor, or a battery coupled to provide power to the system.

In one embodiment, a method of forming a circuit including an array of memory cells involves forming a first electrode, forming a storage element over the first electrode, including forming a layer of doped phase change material over the first electrode, and forming a second electrode over the layer of phase change material and the dopant layer. In one embodiment, the method of forming the layer of doped phase change material involves forming one or more layers of storage material alternating with one or more layers of dopant. In one such embodiment, forming the dopant layer involves depositing a dopant layer comprising aluminum over the first electrode. In one embodiment, forming the dopant layer comprises depositing a dopant layer comprising one of: zirconium (Zr), hafnium (Hf), and silicon (Si). In one embodiment, the dopant layer includes an oxide or nitride. In one embodiment, forming the layer of doped phase change material involves co-depositing a phase change material and a dopant. In one embodiment, the dopant includes aluminum (Al), zirconium (Zr), hafnium (Hf), or silicon (Si). In one embodiment, the dopant layer includes an oxide or nitride. In one embodiment, the method further involves forming a selector element between the storage element and the first electrode, wherein forming the selector element involves forming a layer of doped selector material. In one such embodiment, forming the layer of doped selector material involves forming one or more layers of selector material alternating with one or more layers of dopant. In one embodiment, forming the layer of doped selector material involves co-depositing a selector material and a dopant.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit comprising a three-dimensional (3D) array of memory cells, the 3D array of memory cells comprising:
   conductive wordlines and conductive bitlines to access memory cells of the 3D array;
   a layer of storage material to store data, the layer of storage material located between the conductive wordlines and the conductive bitlines; and
   a layer of selector material between the conductive wordlines and the conductive bitlines, the layer of selector material including a doped chalcogenide material, the doped chalcogenide material including aluminum oxide or aluminum nitride.

2. The circuit of claim 1, wherein the doped chalcogenide material has a dopant concentration in a range of 1-7 at %.

3. The circuit of claim 1, wherein the doped chalcogenide material includes a solid solution of a chalcogenide material and aluminum oxide or aluminum nitride.

4. The circuit of claim 1, wherein the layer of storage material and the layer of selector material are patterned along the conductive wordlines and along the conductive bitlines.

5. The circuit of claim 1, wherein the layer of storage material is between the layer of selector material and the conductive bitlines.

6. The circuit of claim 1, further comprising:
   first electrodes between the conductive wordlines and the layer of selector material;
   second electrodes between the layer of selector material and the layer of storage material; and
   third electrodes between the layer of storage material and the conductive bitlines.

7. The circuit of claim 1, wherein:
   the layer of storage material is doped with a dopant including aluminum.

8. The circuit of claim 1, wherein:
   the layer of storage material is doped with a dopant including zirconium.

9. The circuit of claim 1, wherein:
   the layer of storage material is doped with a dopant including hafnium.

10. The circuit of claim 1, wherein:
    the layer of storage material is doped with a dopant including silicon.

11. The circuit of claim 1, wherein the layer of storage material comprises germanium-antimony-tellurium (GST).

12. A system comprising:
    a processor; and
    a memory device communicatively coupled with the processor, the memory device including a three-dimensional (3D) array of memory cells, the 3D array of memory cells comprising:

conductive wordlines and conductive bitlines to access memory cells of the 3D array;

a layer of storage material to store data, the layer of storage material located between the conductive wordlines and the conductive bitlines; and a layer of selector material between the conductive wordlines and the conductive bitlines, the layer of selector material including a doped chalcogenide material, the doped chalcogenide material including aluminum oxide or aluminum nitride.

13. The system of claim 12, wherein:

the layer of storage material is doped with a dopant including aluminum.

14. The system of claim 12, wherein:

the layer of storage material is doped with a dopant including zirconium.

15. The system of claim 12, wherein:

the layer of storage material is doped with a dopant including hafnium.

16. The system of claim 12, wherein:

the layer of storage material is doped with a dopant including silicon.

\* \* \* \* \*